United States Patent
Lim

(10) Patent No.: US 11,793,017 B2
(45) Date of Patent: Oct. 17, 2023

(54) ADHESIVE FILM FOR DISPLAY DEVICE, DISPLAY DEVICE INCLUDING THE SAME, AND METHOD FOR MANUFACTURING THE SAME

(71) Applicant: Samsung Display Co., Ltd., Yongin-si (KR)

(72) Inventor: Kukbin Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/835,855

(22) Filed: Jun. 8, 2022

(65) Prior Publication Data

US 2022/0302412 A1    Sep. 22, 2022

Related U.S. Application Data

(62) Division of application No. 16/819,145, filed on Mar. 15, 2020, now Pat. No. 11,362,300.

(30) Foreign Application Priority Data

May 2, 2019 (KR) .......................... 10-2019-0051435

(51) Int. Cl.
*H10K 50/842* (2023.01)
*H10K 50/86* (2023.01)
(Continued)

(52) U.S. Cl.
CPC ......... *H10K 50/8426* (2023.02); *B32B 27/08* (2013.01); *H10K 50/86* (2023.02); *H10K 71/00* (2023.02); *H10K 2102/311* (2023.02)

(58) Field of Classification Search
CPC .... H10K 50/8426; H10K 50/86; H10K 71/00; H10K 2102/311; H10K 50/844;
(Continued)

(56) References Cited

U.S. PATENT DOCUMENTS 9,333,725 B2   5/2016   Chaung et al.
9,465,473 B2   10/2016  Lee et al.
(Continued)

FOREIGN PATENT DOCUMENTS

KR   10-2013-0132706   12/2013
KR      10-2014-0052    5/2014
(Continued)

OTHER PUBLICATIONS

Extended European Search Report dated Aug. 7, 2020, issued in European Patent Application No. 20172363.2.
(Continued)

*Primary Examiner* — Dao H Nguyen
(74) *Attorney, Agent, or Firm* — H.C. Park & Associates, PLC

(57) ABSTRACT

A display device includes a display panel, a cover member disposed on the display panel, and an adhesive layer disposed between the display panel and the cover member. The adhesive layer has a first surface facing the cover member and a second surface facing the display panel, and includes a first area and a second area disposed at positions different from each other in a first direction from the first surface toward the second surface. A modulus of the first area is different from a modulus of the second area.

8 Claims, 27 Drawing Sheets

(51) Int. Cl.
  *H10K 71/00* (2023.01)
  *H10K 102/00* (2023.01)
  *B32B 27/08* (2006.01)

(58) Field of Classification Search
  CPC .... H10K 50/00; B32B 27/08; B32B 2457/20; G02F 2202/023; G02F 2203/05
  See application file for complete search history.

(56) References Cited

U.S. PATENT DOCUMENTS

| | | | |
|---|---|---|---|
| 10,054,726 B2 | 8/2018 | Park | |
| 2005/0037281 A1* | 2/2005 | Sato | H05K 3/064 430/270.1 |
| 2009/0233181 A1* | 9/2009 | Van Heesch | G03F 7/001 430/2 |
| 2012/0206804 A1 | 8/2012 | Nam et al. | |
| 2014/0118902 A1 | 5/2014 | Kim | |
| 2014/0160405 A1 | 6/2014 | Huh et al. | |
| 2014/0178608 A1* | 6/2014 | Yoon | G02B 5/30 428/1.55 |
| 2014/0335316 A1 | 11/2014 | Fukushima et al. | |
| 2016/0079329 A1 | 3/2016 | Lee et al. | |
| 2016/0111678 A1 | 4/2016 | Lee et al. | |
| 2016/0237319 A1 | 8/2016 | Takarada et al. | |
| 2016/0282661 A1 | 9/2016 | Nam | |
| 2017/0121564 A1 | 5/2017 | Cho et al. | |
| 2017/0355178 A1* | 12/2017 | Sano | G03G 15/00 |
| 2018/0057705 A1* | 3/2018 | Jung | C09D 7/65 |
| 2018/0132370 A1 | 5/2018 | Choi et al. | |
| 2018/0196169 A1 | 7/2018 | Choi et al. | |
| 2021/0300010 A1 | 9/2021 | Choi et al. | |

FOREIGN PATENT DOCUMENTS

| | | |
|---|---|---|
| KR | 10-2016-0032795 | 3/2016 |
| KR | 10-2016-0124541 | 10/2016 |
| KR | 10-2017-0072973 | 6/2017 |
| KR | 10-1869928 | 12/2017 |
| KR | 10-2018-0025866 | 3/2018 |
| KR | 10-2018-0052810 | 5/2018 |

OTHER PUBLICATIONS

Office Action dated Aug. 17, 2021 from the European Patent Office for European Patent Application No. 20172363.2.
Non-Final Office Action dated Sep. 14, 2021, issued to U.S. Appl. No. 16/819,145.
Notice of Allowance dated Feb. 11, 2022, issued to U.S. Appl. No. 16/819,145.

* cited by examiner

------- First initiator

ADHESIVE FILM FOR DISPLAY DEVICE, DISPLAY DEVICE INCLUDING THE SAME, AND METHOD FOR MANUFACTURING THE SAME

CROSS-REFERENCE TO RELATED APPLICATIONS

This application is a division of U.S. patent application Ser. No. 16/819,145, filed on Mar. 15, 2020, which claims priority from and the benefit of Korean Patent Application No. 10-2019-0051435, filed on May 2, 2019, which is hereby incorporated by all purposes as if fully set forth herein.

BACKGROUND

Field

Exemplary implementations of the invention relate generally to a layer for display devices and, more specifically, to an adhesive film for display devices, a display device including the adhesive film, and a method for manufacturing the adhesive film for display devices.

Discussion of the Background

In recent times, liquid crystal display (LCD) devices or organic light emitting diode (OLED) display devices may be used as a display device for electronic devices, e.g., mobile phones, navigation devices, digital cameras, electronic books, portable game machines, and various terminals.

In a conventional display device used in such electronic devices, a cover window that is transparent may be provided in front of a display panel so that users may view a display area of the display panel. The cover window should be strong against external impact to protect the display panel in the device.

In addition, recently, studies have been actively conducted on display devices that may be foldable or rollable, and a cover window applied to such a display device includes a transparent window that is flexible to be folded.

In such a case, an adhesive layer for attaching the cover window on the display panel may be disposed between the display panel and the cover window.

The above information disclosed in this Background section is only for understanding of the background of the inventive concepts, and, therefore, it may contain information that does not constitute prior art.

SUMMARY

Applicant discovered that it is preferable to use an adhesive layer having a relatively high modulus and a relatively high bending stiffness to prevent a cover window from being broken when a display device is folded or rolled. On the other hand, an adhesive layer having a relatively low modulus and a relatively low bending stiffness may be preferable to prevent occurrence of bright spots due to an impact applied to the display panel.

Adhesive films and display devices including adhesive films constructed according to the principles and exemplary implementations of the invention and methods of manufacturing adhesive film according to the principles and exemplary implementations of the invention are capable of preventing or at least reducing a cover member from being damaged and/or broken when a display device is folded and preventing or at least reducing visually recognizable spots such as bright spots from occurring due to an impact applied to the display device and/or its display panel. For example, an adhesive layer for a display device has a modulus and a bending stiffness varying in a thickness and/or length direction.

An adhesive layer for a display device may include a first area having a relatively high modulus and a relatively high bending stiffness and a second area having a relatively low modulus and a relatively low bending stiffness. For example, the first area may include a first surface of the adhesive layer, and the second area may include a second surface of the adhesive layer opposing the first surface. The first area of the adhesive layer may prevent or at least reduce the cover member from being damaged and/or broken when the display device is folded, and the second area of the adhesive layer may prevent or at least reduce bright spots from occurring due to an impact applied to the display device. The first surface may be a front surface of the adhesive layer, and the second surface may be a rear surface of the adhesive layer. For another example, the first area may overlap a folding area of the display device, and the second area may overlap a non-folding area of the display device. In this case, the first area may prevent or at least reduce buckling due to shearing forces of the adhesive layer that may be generated when the folding area is folded, and the second area may prevent or at least reduce bright spots from occurring due to an impact applied to the display device.

An adhesive layer for a display device may include a single layer. In this manner, the manufacturing processes may be simplified, and image quality of the display device may be improved since the single adhesive layer may prevent or at least reduce reflection or refraction of light that may occur at an interface between plural layers. In addition, since the single adhesive layer does not easily peel off dissimilarly to plural layers, the adhesive layer and the display device may be robust to stress.

Additional features of the inventive concepts will be set forth in the description which follows, and in part will be apparent from the description, or may be learned by practice of the inventive concepts.

According to one aspect of the invention, a display device includes: a display panel; a cover member disposed on the display panel; and an adhesive layer disposed between the display panel and the cover member, wherein the adhesive layer has a first surface facing the cover member and a second surface facing the display panel, and includes a first area and a second area disposed at positions different from each other in a first direction from the first surface toward the second surface, and wherein a modulus of the first area is different from a modulus of the second area.

The adhesive layer may form a single layer including the first area and the second area without an interface between the first surface and the second surface.

The adhesive layer may have a continuous modulus between the first surface and the second surface.

The modulus of the first area may be about 100 Kpa or higher and about 1000 Kpa or lower, and the modulus of the second area may be about 100 Kpa or lower.

A difference between the modulus of the first area and the modulus of the second area may be about 100 Kpa or greater.

The first area may include the first surface; the second area may include the second surface; and the modulus of the first area may be higher than the modulus of the second area.

The first area may include the first surface; the second area may include the second surface; and the modulus of the first area may be lower than the modulus of the second area.

A bending stiffness of the first area may be about 30 N·cm or higher and about 50 N·cm or lower, and a bending stiffness of the second area may be about 15N·cm or higher and about 30 N·cm or lower.

Each the moduli of the first and the second areas may vary gradually along the first direction; the first area may include the first surface; and the second area may include the second surface.

The adhesive layer may further include a third area having a modulus that varies gradually along the first direction.

The third area may have a modulus that decreases gradually along the first direction.

The first area may include the first surface; the second area may include the second surface; the third area may be disposed between the first area and the second area; and the modulus of the first area and the modulus of the second area may be constant in the first direction.

The third area may have as a modulus that increases gradually along the first direction.

The first area may include a third area having a modulus that decreases gradually along the first direction, and the second area may include a fourth area having a modulus that increases gradually along the first direction.

The first area may include the first surface, and the second area may include the second surface.

The first area may include the second surface, and the second area may include the first surface.

The adhesive layer further may include a third area disposed between the first area and the second area, and each of the modulus of the first area and the modulus of the second area may be higher than a modulus of the third area.

The adhesive layer may further include a third area disposed between the first area and the second area, and each of the modulus of the first area and the modulus of the second area may be lower than a modulus of the third area.

The display device is foldable or rollable.

According to another aspect of the invention, a display device includes: a display panel; a cover member disposed on the display panel; and a single adhesive layer including a first surface facing the cover member and a second surface facing the display panel without an interface between the first surface and the second surface, the single adhesive layer being disposed between the display panel and the cover member, wherein a modulus of the first surface is higher than a modulus of the second surface.

A difference between the modulus of the first surface and the modulus of the second surface may be about 100 Kpa or greater.

According to still another aspect of the invention, a display device includes: a display panel; a cover member disposed on the display panel; and an adhesive layer disposed between the display panel and the cover member, wherein the adhesive layer includes non-folding areas and a folding area disposed between the non-folding areas, and wherein a modulus of the folding area is greater than a modulus of the non-folding area.

The modulus of the folding area may be about 100 Kpa or higher and about 1000 Kpa or lower, and the modulus of the non-folding area may be about 100 Kpa or lower.

A difference between the modulus of the folding area and the modulus of the non-folding area may be about 100 Kpa or greater.

According to yet another aspect of the invention, an adhesive film for a display device, the adhesive film having a first surface and a second surface opposing the first surface, includes a first area and a second area disposed at positions different from each other in a thickness direction from the first surface toward the second surface, wherein a modulus of the first area is different from a modulus of the second area.

The adhesive film may form a single layer including the first area and the second area without an interface between the first surface and the second surface.

A maximum value of a modulus of the adhesive film may be about 100 Kpa or higher and about 1000 Kpa or lower, and a minimum value of the modulus of the adhesive film may be about 100 Kpa or lower.

A deviation of a modulus of the adhesive film in the thickness direction may be about 100 Kpa or greater.

A maximum value of a bending stiffness of the adhesive film may be about 30 N·cm or higher and about 50 N·cm or lower, and a minimum value of the bending stiffness of the adhesive film may be about 15 N·cm or higher and about 30 N·cm or lower.

A modulus of the adhesive film may increase gradually along the thickness direction.

The first area may include a third area having a modulus that decreases gradually along the thickness direction, and the second area may include a fourth area having a modulus that increases gradually along the thickness direction.

The adhesive film may further include a third area disposed between the first area and the second area, wherein each of the modulus of the first area and the modulus of the second area may be higher than a modulus of the third area.

The adhesive film may further include a third area disposed between the first area and the second area, wherein each of the modulus of the first area and the modulus of the second area may be lower than a modulus of the third area.

According to still yet another aspect of the invention, an adhesive film for a display device includes a first surface and a second surface opposing the first surface without an interface between the first surface and the second surface, wherein a modulus of the first surface is higher than a modulus of the second surface.

Accordingly to one aspect of the invention, a method of manufacturing an adhesive film for a display device, the method includes: forming, on a first release film, a first composition including a resin and a first initiator for initiating a polymerization reaction of the resin; forming, on the first composition which has been applied, a second composition including the resin and a second initiator for initiating the polymerization reaction of the resin; irradiating the first composition and the second composition, which have been applied, with light having a first range of wavelengths; and irradiating the first composition and the second composition, which have been applied, with light having a second range of wavelengths, wherein the first initiator initiates the polymerization reaction of the resin with the light having the first range of wavelengths without activating initiation of the polymerization reaction with the light having the second range of wavelengths, and wherein the second initiator initiates the polymerization reaction of the resin with the light having the second range of wavelengths without activating the initiation of the polymerization reaction with the light having the first range of wavelengths.

The method may further include: forming, on the second composition, a third composition including the resin and a third initiator, wherein the third initiator initiates the polymerization reaction of the resin with light having a third range of wavelengths without activating the initiation of the polymerization reaction with the light having the second range of wavelengths.

The third initiator may initiate the polymerization reaction of the resin with the light having the third range of wavelengths without activating the initiation of the polymerization reaction with the light having the first range of wavelengths.

An irradiation time of the light having the first range of wavelengths may be different from an irradiation time of the light having the second range of wavelengths.

Intensity of the light having the first range of wavelengths may be different from intensity of the light having the second range of wavelengths.

A concentration of the first initiator with respect to the first composition is different from a concentration of the second initiator with respect to the second composition.

The forming of the second composition on the first composition may include: applying the second composition on a second release film; and laminating the first release film and the second release film on each other in a state in which the first composition and the second composition, which have been applied, face each other.

The forming of the first composition on the first release film may include: applying the first initiator on the first release film; and applying the resin on the first initiator which has been applied. The applying of the second composition on the second release film may include: applying the second composition on the second release film; and applying the resin on the second initiator which has been applied.

According to another aspect of the invention, a method of manufacturing an adhesive film for a display device includes: applying an initiator to a release film; applying a resin on the initiator which has been applied; and irradiating the initiator and the resin, which have been applied, with light.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
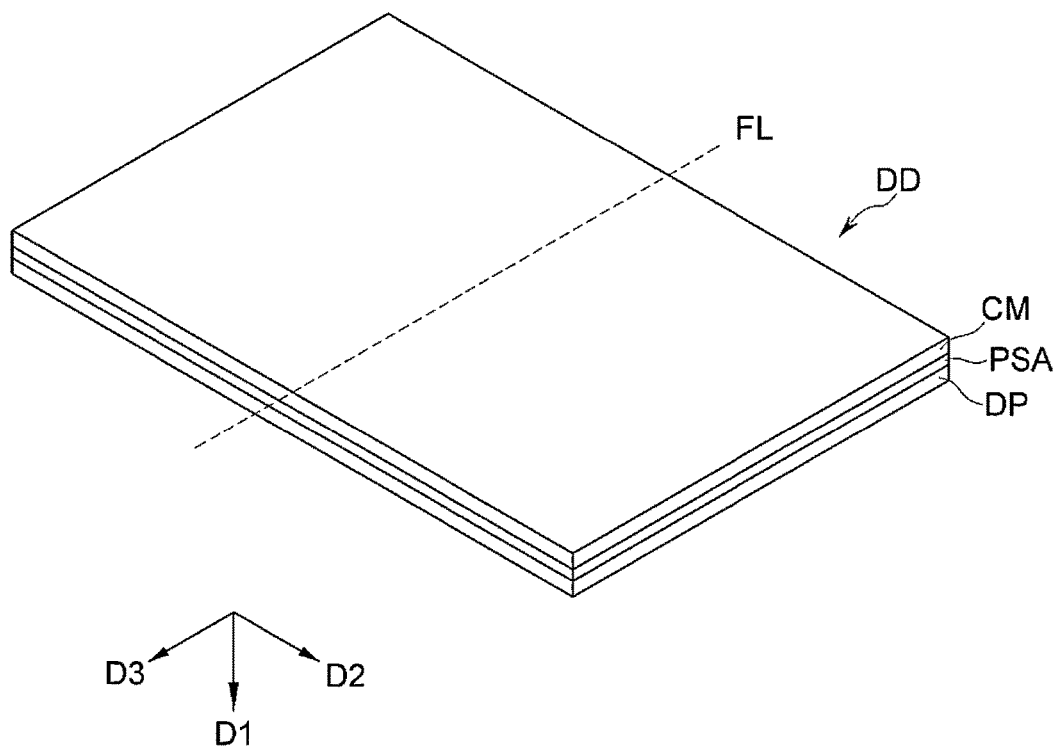
FIG. 1 is a perspective view of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
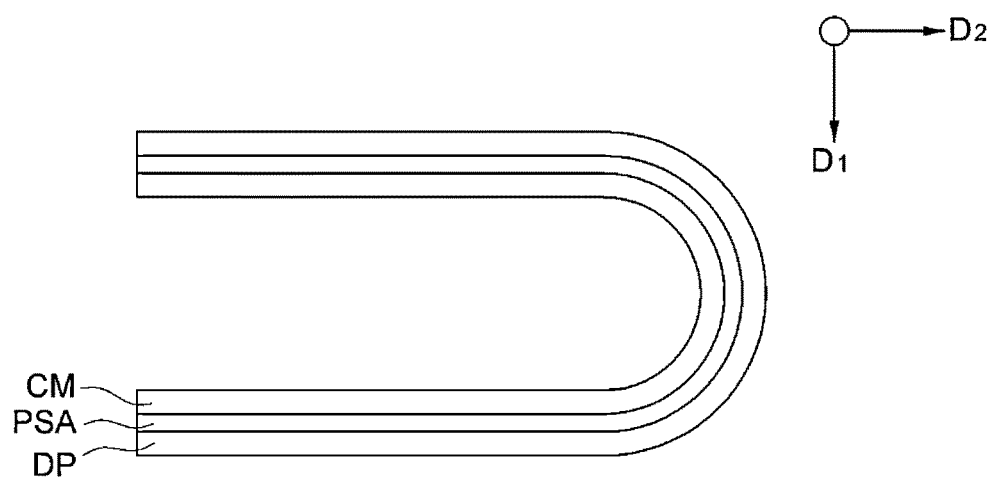
FIG. 2 is a cross-sectional view illustrating a state in which the display device of FIG. 1 is folded.
Figure 3:
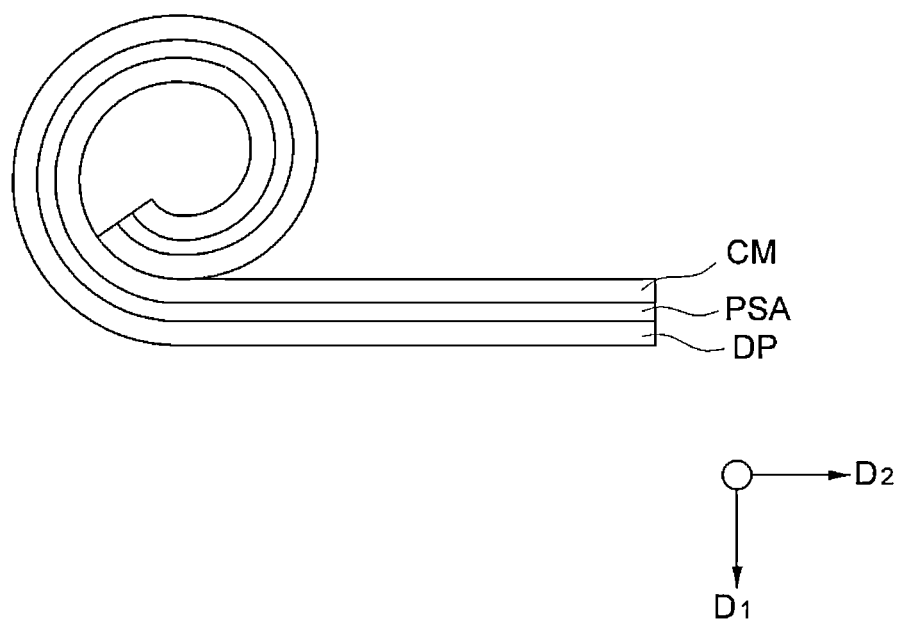
FIG. 3 is a cross-sectional view illustrating a state in which the display device of FIG. 1 is rolled.

FIG. 1 is a perspective view of a display device constructed according to the principles of the invention. FIG. 2 is a cross-sectional view illustrating a state in which the display device of FIG. 1 is folded. FIG. 3 is a cross-sectional view illustrating a state in which the display device of FIG. 1 is rolled.

Referring to FIG. 1, a display device DD includes a display panel DP at which images are displayed, a cover member CM disposed on the side where images are displayed, and an adhesive layer PSA for attaching the display panel DP and the cover member CM.

In an embodiment, the display device DD may include any one of a liquid crystal display (LCD) panel, a light emitting diode (LED) display panel, an organic light emitting diode (OLED) display panel, or a microelectromechanical system (MEMS) display panel, and an electronic paper display panel.

The display device DD, i.e., the display panel DP and the cover member CM, may be provided in a flat state as illustrated in FIG. 1, but it may be provided in a different shape with at least part of the display panel DP and the cover member CM being transformed.

Referring to FIGS. 2 and 3 together with FIG. 1, at least part of the display device DD may have flexibility, or the entirety of the display device DD may have flexibility. Since the display device DD has flexibility, the display device DD may be folded as illustrated in FIG. 2 or rolled as illustrated in FIG. 3, in a flexible area.

Referring to FIG. 2, a folding line FL, along which the display device DD is folded, may pass through the center of the display device DD and may be parallel to a third direction D3. However, the position of the folding line FL is not limited thereto, and may be provided in a direction parallel to a second direction D2, or in a direction oblique to the second direction D2 or the third direction D3. In addition, it is obviously not necessary that the folding line FL passes through the center of the display device DD.

In addition, the display device DD may be provided in an infolding scheme in which an image display surface is folded inwardly along the folding line FL not to be viewed, or in an outfolding scheme in which the image display surface is folded outwardly along the folding line FL to be viewed. In addition, when the display device DD is folded along a plurality of folding lines FL, part of the image display surface may be folded inwardly and another part of the image display surface may be folded outwardly.

A first direction D1 refers to a direction perpendicular to the second direction D2 and the third direction D3. The first direction D1 corresponds to a thickness direction of the display device DD, the display panel DP, the cover member CM, and the adhesive layer PSA. In the following description, the first direction D1 is defined as the direction from the cover member CM toward the display panel DP. A length of the display device DD in the second direction D2 may be greater than a length of the display device DD in the third direction D3. The first direction D1, the second direction D2, and the third direction D3 may be referred to as a thickness direction, a width direction, and a length direction of the display device DD, the display panel DP, the adhesive layer PSA, or the cover member CM, respectively.

Referring to FIG. 3, the display device DD may be rollable so that one surface faces and/or contact another surface. A direction in which the display device DD is rolled may be the second direction D2 or the third direction D3. However, embodiments are not limited thereto. For example, the display device DD may be rolled in a direction oblique to the second direction D2 or the third direction D3. In addition, in the display device DD, the rolled area may be part of the display device DD, or the entire area of the display device DD may be rolled.

Although flexibility has been described with reference to the display device DD for convenience of description, it may be applied to the display panel DP, the cover member CM, the adhesive layer PSA, and/or their layers.

Figure 4:
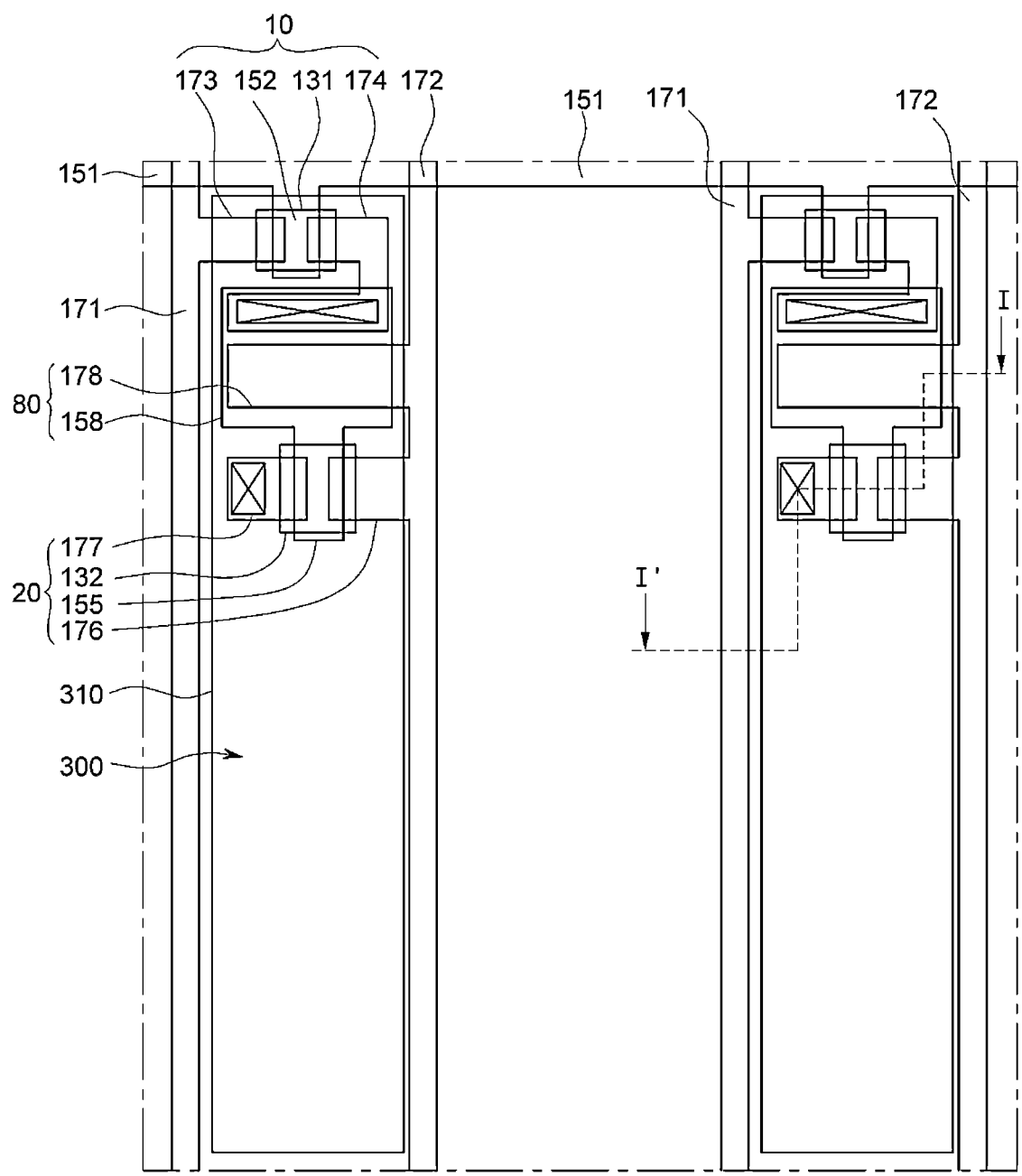
FIG. 4 is a plan view of an embodiment of some of pixels of a display device.
Figure 5:
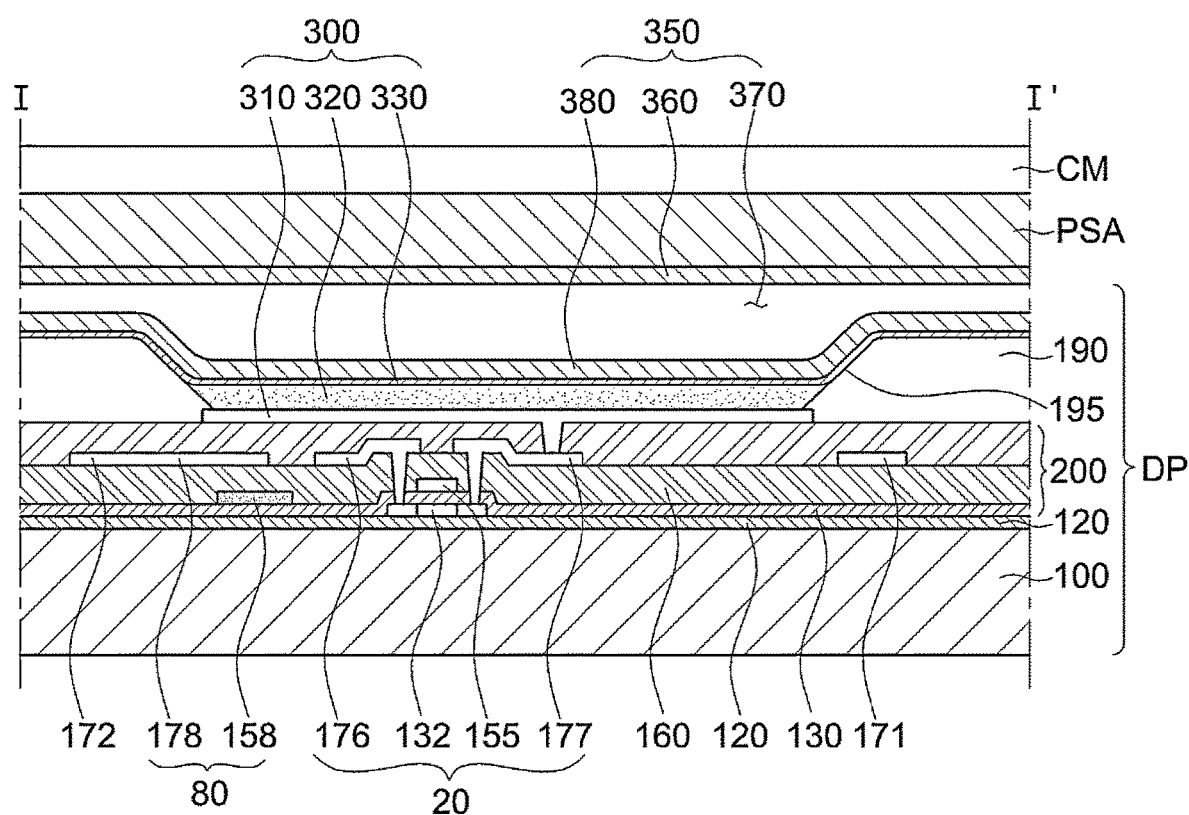
FIG. 5 is a cross-sectional view taken along line I-I' of FIG. 4.

FIG. 4 is a plan view of an embodiment of some of pixels of a display device. FIG. 5 is a cross-sectional view taken along line I-I' of FIG. 4.

Referring to FIGS. 4 and 5, an OLED display device DD includes a substrate 100, a wiring unit 200, an OLED 300, and a thin film encapsulation layer 350. The OLED display device DD may further include a buffer layer 120 and a pixel defining layer 190.

The substrate 110 may include an insulating material selected from the group consisting of glass, quartz, ceramic, and plastic. However, embodiments are not limited thereto, and the substrate 100 may include a metal material, such as stainless steel.

The buffer layer 120 is disposed on the substrate 110. The buffer layer 120 may include one or more layers selected from various inorganic layers and organic layers. The buffer layer 120 serves to prevent unnecessary substances, e.g., impurities or moisture, from penetrating into the wiring unit 200 or the OLED 300, and to planarize a surface therebelow. However, the buffer layer 120 is not necessarily required and may be omitted depending on the type of the substrate 100 and the process conditions.

The wiring unit 200 is disposed on the buffer layer 120. The wiring unit 200 includes a plurality of thin film transistors (TFTs) 10 and 20, and drives the OLED 300. That is, the OLED 300 emits light according to a driving signal received from the wiring unit 200 to display images.

FIGS. 4 and 5 illustrate an active matrix-type organic light emitting diode (AMOLED) display device having a 2Tr-1Cap structure which includes two TFTs 10 and 20, and one capacitor 80 in each pixel PX. However, embodiments are not limited thereto, and the OLED display device DD may include three or more transistors and two or more capacitors in each pixel, and may have various structures including additional wirings. Herein, a pixel refers to a minimum unit for displaying an image, and the OLED display device DD displays images through a plurality of pixels.

Each pixel includes a switching TFT 10, a driving TFT 20, the capacitor 80, and the OLED 300. A configuration of the switching TFT 10, the driving TFT 20, and the capacitor 80 is collectively referred to as the wiring unit 200. In addition, a gate line 151 extending along a direction, and a data line 171 and a common power line 172 insulated from and intersecting the gate line 151 are disposed at the wiring unit 200. Each pixel may be defined by the gate line 151, the data line 171, and the common power line 172, which serve as a boundary, but embodiments are not limited thereto. The pixels may be defined by the pixel defining layer 190.

The OLED 300 includes a first electrode 310, an organic light emitting layer 320 on the first electrode 310, and a second electrode 330 on the organic light emitting layer 320. Holes and electrons are applied from the first electrode 310 and the second electrode 330, respectively, into the organic light emitting layer 320 and then combined with each other therein to form an exciton. When the exciton falls from an excited state to a ground state, light is emitted.

The capacitor 80 includes a pair of capacitor plates 158 and 178, having an insulating interlayer 160 interposed therebetween. In such an embodiment, the insulating interlayer 160 may be a dielectric element. A capacitance of the capacitor 80 is determined by electric charges accumulated in the capacitor 80 and a voltage across the pair of capacitor plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177. A gate insulating layer 130 is provided to insulate the semiconductor layers 131 and 132 and the gate electrodes 152 and 155.

The switching TFT 10 may function as a switching element which selects a pixel to perform light emission. The switching gate electrode 152 is connected to the gate line 151, and the switching source electrode 173 is connected to the data line 171. The switching drain electrode 174 is spaced apart from the switching source electrode 173 and connected to one of the capacitor plates, e.g., the capacitor plate 158.

The driving TFT 20 applies a driving power, which allows the organic light emitting layer 320 of the OLED 300 in a selected pixel to emit light, to the first electrode 310 which is a pixel electrode. The driving gate electrode 155 is connected to the capacitor plate 158 that is connected to the switching drain electrode 174. Each of the driving source electrode 176 and the other of the capacitor plates, e.g., the capacitor plate 178, is connected to the common power line 172. The driving drain electrode 177 is connected to the first electrode 310 of the OLED 300 through a contact hole.

With the above-described structure, the switching TFT 10 is operated based on a gate voltage applied to the gate line 151 and serves to transmit a data voltage applied to the data line 171 to the driving TFT 20. A voltage equivalent to a difference between a common voltage applied to the driving TFT 20 from the common power line 172 and the data voltage transmitted by (or from) the switching TFT 10 is stored in the capacitor 80, and a current corresponding to the voltage stored in the capacitor 80 flows to the OLED 300 through the driving TFT 20 such that the OLED 300 may emit light.

The OLED 300 emits light according to the driving signal received from the wiring unit 200. In addition, the OLED 300 may include the first electrode 310 serving as an anode for injecting holes, the second electrode 330 serving as a cathode for injecting electrons, and the organic light emitting layer 320 disposed between the first electrode 310 and the second electrode 330. That is, the first electrode 310, the organic light emitting layer 320, and the second electrode 330 are sequentially stacked to form the OLED 300. However, embodiments are not limited thereto. For example, the first electrode 310 may serve as a cathode and the second electrode 330 may serve as an anode.

In an embodiment, the first electrode 310 may include a reflective film, and the second electrode 330 may include a transflective film. Accordingly, light generated in the organic light emitting layer 320 may pass through the second electrode 330 to be emitted outwards. That is, the OLED display device DD may have a top-emission type structure.

In an embodiment, the transflective film and the reflective film may include one or more of metals, e.g., magnesium (Mg), silver (Ag), gold (Au), calcium (Ca), lithium (Li), chromium (Cr), and aluminum (Al), or an alloy thereof. In such an embodiment, whether the film is a transflective type or a reflective type depends on the thickness of the film. Typically, the transflective film has a thickness of about 200 nm or less. As the thickness of the transflective film decreases, light transmittance increases, and as the thickness of the transflective film increases, light transmittance decreases.

In addition, the first electrode 310 may include a transparent conductive film. That is, the first electrode 310 may have a multilayer structure including a reflective film and a transparent conductive film. The transparent conductive film of the first electrode 310 is disposed between the reflective film and the organic light emitting layer 320. In addition, the first electrode 310 may have a triple-layer structure in which a transparent conductive film, a reflective film, and a transparent conductive film are sequentially stacked. The first electrode 310 may only include a transparent conductive film. In such a case, the first electrode 310 becomes a transparent electrode.

The transparent conductive film may include transparent conductive oxide (TCO) such as indium tin oxide (ITO), indium zinc oxide (IZO), zinc oxide (ZnO), or indium oxide ($In_2O_3$). The transparent conductive film has a relatively high work function. Accordingly, when the first electrode 310 includes a transparent conductive film, hole injection through the first electrode 310 is facilitated.

The second electrode 330 may include a transparent conductive film. When the second electrode 330 includes a transparent conductive film, the second electrode 330 may be an anode for injecting holes. In such an embodiment, the first electrode 310 may only include a reflective film to serve as a cathode.

At least one of a hole injection layer HIL and a hole transporting layer HTL may further be disposed between the first electrode 310, which serves as an anode, and the organic light emitting layer 320, and at least one of an electron transporting layer ETL and an electron injection layer EIL may further be disposed between the organic light emitting layer 320 and the second electrode 330, which serves as a cathode.

In an embodiment, an additional layer may be further disposed between the organic light emitting layer 320 and the first electrode 310 and between the organic light emitting layer 320 and the second electrode 330.

The pixel defining layer 190 has an opening 195. The opening 195 of the pixel defining layer 190 exposes part of the first electrode 310. The first electrode 310, the organic light emitting layer 320, and the second electrode 330 are sequentially stacked in the opening 195 of the pixel defining layer 190. In such an embodiment, the second electrode 213 may also be disposed on the pixel defining layer 190, as well as on the organic light emitting layer 320. In addition, the HIL, the HTL, the ETL, and the EIL may also be disposed between the pixel defining layer 190 and the second electrode 330. The OLED 300 emits light from the organic light emitting layer 320 in the opening 195 of the pixel defining layer 190. As such, the opening 195 of the pixel defining layer 190 defines a light emission area.

The thin film encapsulation layer 350 is disposed on the second electrode 330. The thin film encapsulation layer 350 seals the first electrode 310, the OLED 320, and the second electrode 330, and protects them from the external environment.

The thin film encapsulation layer 350 may have a structure in which at least one organic layer 370 and at least one inorganic layer 360 and 380 are alternately disposed. However, embodiments are not limited thereto, and the thin film encapsulation layer 350 may include a single layer of an organic layer or an inorganic layer.

The display panel DP may include, for example, a touch sensing layer, a polarization layer, and a color filter layer disposed on the thin film encapsulation layer 350.

The cover member CM is disposed on a front surface of the display panel DP on which images are displayed. The adhesive layer PSA is interposed between the cover member CM and the front surface of the display panel DP. The cover member CM may transmit light generated by the display panel DP.

The cover member CM may include, for example, a window including a flexible material such as tempered glass, tempered plastic, or a polymer material. The window may be a flexible glass in the form of a thin film. The glass window in the form of a thin film may have a thickness of about 100 μm or less, and more preferably about 75 μm or less.

The cover member CM may further include a protective film attached to the front surface or a rear surface of the window. In addition, the cover member CM may include a touch sensing layer, a polarization layer, a color filter layer, or the like disposed at the front surface or the rear surface of the window. In addition, the cover member CM may include a light blocking layer and a hard coating layer formed at the front surface or the rear surface of the window.

The adhesive layer PSA is disposed between the cover member CM and the display panel DP to attach them to each other. The adhesive layer PSA may directly contact an upper surface of the display panel DP and a lower surface of the cover member CM. The adhesive layer PSA may include a pressure sensitive adhesive or an optical cleared adhesive.

Figure 6:
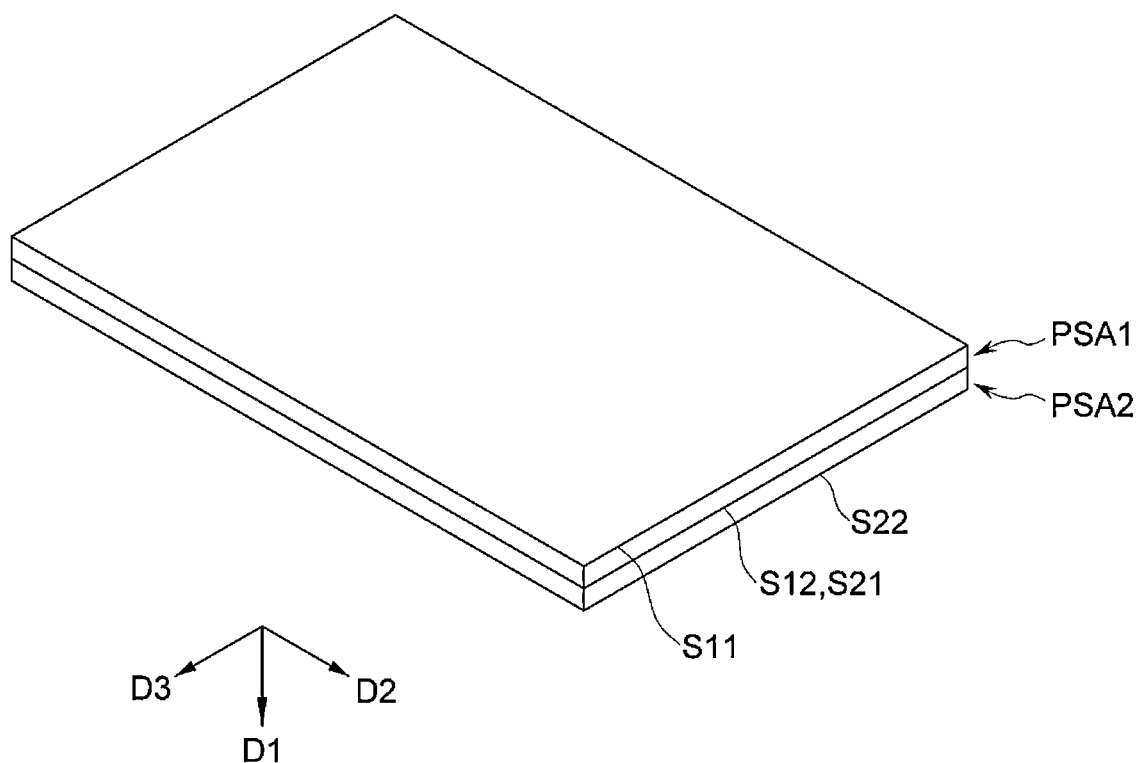
FIG. 6 is a perspective view of an embodiment of a plurality of adhesive layers.
Figure 7:
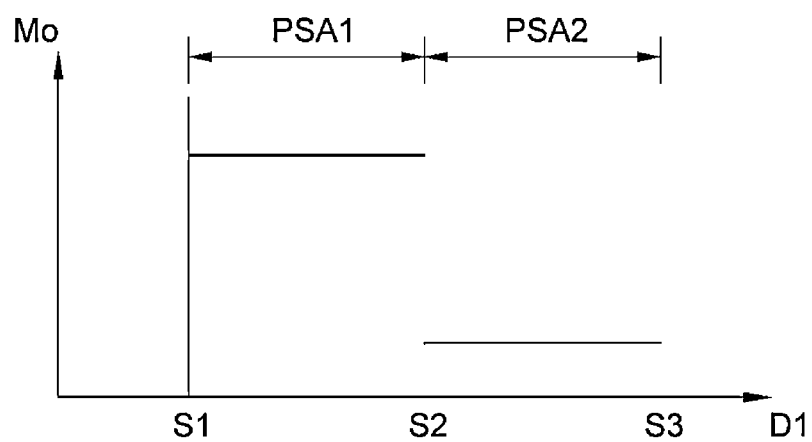
FIG. 7 is a graph illustrating a modulus of an embodiment of a plurality of adhesive layers.

FIG. 6 is a perspective view of an embodiment of a plurality of adhesive layers. FIG. 7 is a graph illustrating a modulus of an embodiment of a plurality of adhesive layers.

Referring to FIG. 6, at least two adhesive layers PAS1 and PSA2 may be provided between the cover member CM and the display panel DP of FIG. 1. The first adhesive layer PAS1 has a front surface S11 facing the cover member CM and a rear surface S12 facing the display panel DP. The second adhesive layer PAS2 has a front surface S21 facing the cover member CM and a rear surface S22 facing the display panel DP. The front surface S11 of the first adhesive layer PSA1 may directly contact the cover member CM, or the window of the cover member CM. The rear surface S22 of the second adhesive layer PAS2 may directly contact the display panel DP, or the thin film encapsulation layer 350 of the display panel DP. The rear surface S12 of the first adhesive layer PSA1 and the front surface S21 of the second adhesive layer PSA2 contact each other.

Referring to FIG. 7, the first adhesive layer PSA1 has a modulus higher than a modulus of the second adhesive layer PSA2. Each of the first adhesive layer PSA1 and the second adhesive layer PSA2 may have a substantially constant modulus in the first direction D1 which is the thickness direction. The modulus of the first adhesive layer PSA1, or the front surface S11 of the first adhesive layer PSA1 may be about 100 Kpa or higher and about 1000 Kpa or lower, and the modulus of the second adhesive layer PSA2, or the rear surface S22 of the second adhesive layer PSA2 may be about 100 Kpa or lower. A difference between the modulus of the first adhesive layer PSA1, or the front surface S11 of the first adhesive layer PSA1 and the modulus of the second adhesive layer PSA2, or the rear surface S22 of the second adhesive layer PSA2 may be about 100 Kpa or greater.

The first adhesive layer PSA1 has a bending stiffness higher than a bending stiffness of the second adhesive layer PSA2. Each of the first adhesive layer PSA1 and the second adhesive layer PSA2 may have a substantially constant bending stiffness in the first direction D1 which is the thickness direction. The bending stiffness of the first adhesive layer PSA1, or the front surface S11 of the first adhesive layer PSA1 may be about 30 N·cm or higher and about 50 N·cm or lower, and the bending stiffness of the second adhesive layer PSA2, or the rear surface S22 of the second adhesive layer PSA2 may be about 15 N·cm or higher and about 30 N·cm or lower. A difference between the bending stiffness of the first adhesive layer PSA1, or the front surface S11 of the first adhesive layer PSA1 and the bending stiffness of the second adhesive layer PSA2, or the rear surface S22 of the second adhesive layer PSA2 may be about 15N·cm or greater.

The first adhesive layer PSA1 having a relatively high modulus and a relatively high bending stiffness may substantially prevent the cover member CM, or the window of the cover member CM from being damaged when the display device is folded, and the adhesive layer PSA2 having a relatively low modulus and a relatively low bending stiffness may substantially prevent bright spots from being generated by an impact applied to the display panel DP.

Figure 8:
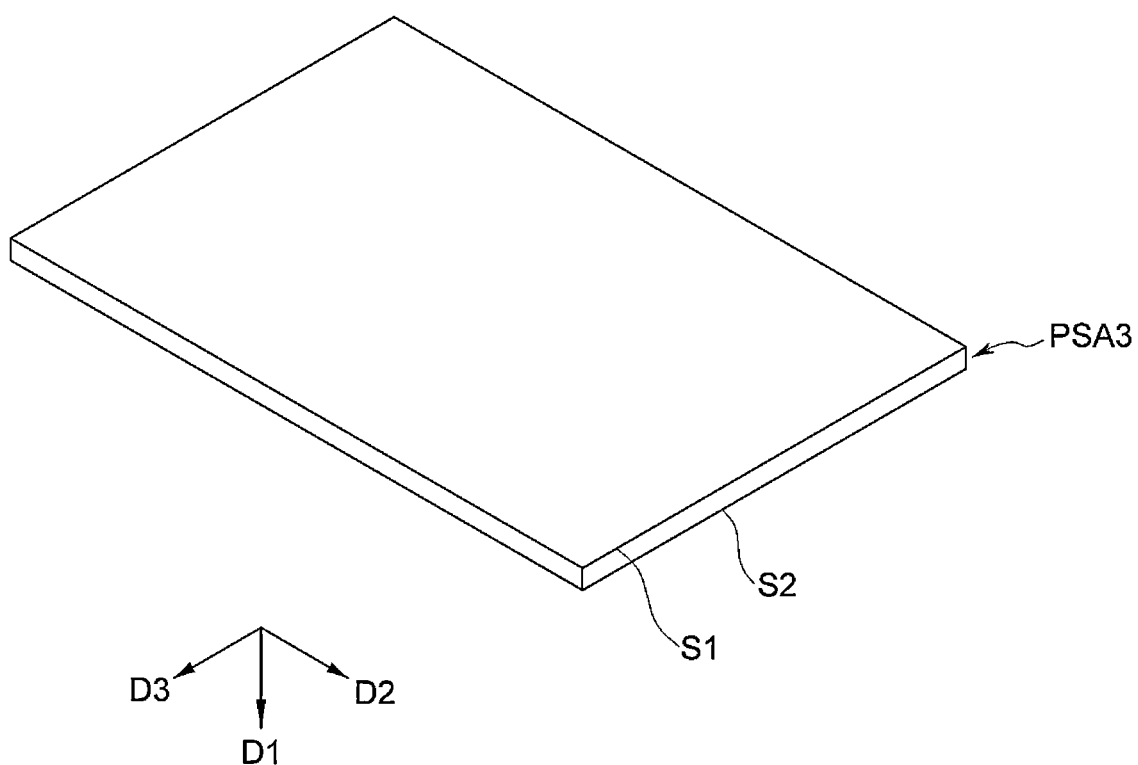
FIG. 8 is a perspective view of an embodiment of an adhesive layer.

FIG. 8 is a perspective view of an embodiment of an adhesive layer. FIGS. 9 to 12 are graphs illustrating moduli of embodiments of an adhesive layer. In FIGS. 9 to 12, a vertical axis denotes a modulus or bending stiffness, and the horizontal axis denotes a position in the first direction D1.

Referring to FIG. 8, an adhesive layer PAS3 may be provided between the cover member CM and the display panel DP of FIG. 1. The adhesive layer PAS3 has a front surface S1 facing the cover member CM and a rear surface S2 facing the display panel DP. The front surface S1 of the adhesive layer PSA3 may directly contact the cover member CM, or the window of the cover member CM. The rear surface S2 of the adhesive layer PAS3 may directly contact the display panel DP, or the thin film encapsulation layer 350 of the display panel DP. Since the adhesive layer PAS3 forms a single layer, the adhesive layer PAS3 does not include an interface between the front surface S1 and the rear surface S2 of the adhesive layer PSA3.

Figure 9:
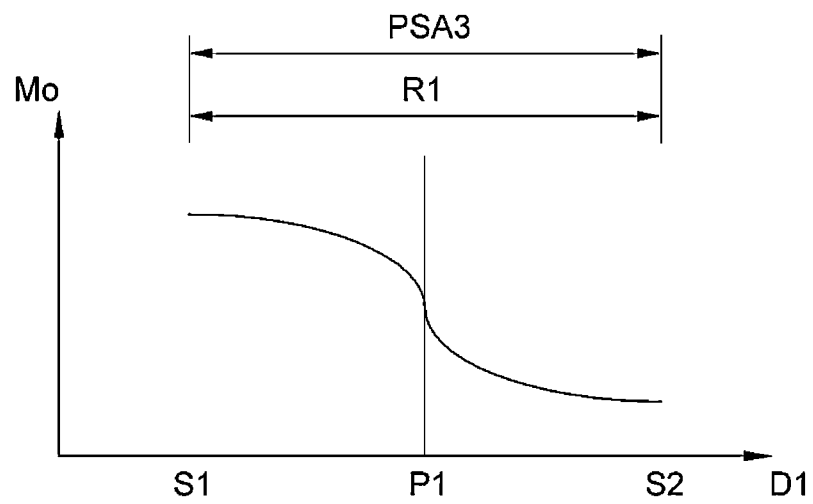
FIGS. 9 to 12 are graphs illustrating moduli of embodiments of an adhesive layer.

The adhesive layer PAS3 may include first and second areas defined to be disposed at different positions from each other in the first direction D1, and the first and second areas may have different moduli from each other Referring to FIG. 9, the front surface S1 of the adhesive layer PSA3 has a modulus or bending stiffness higher than that of the rear surface S2. The adhesive layer PSA3 may have a modulus or bending stiffness that decreases gradually in the first direction D1, which is a direction from the front surface S1 toward the rear surface S2, at a first region R1 throughout the adhesive layer PSA3. A modulus variation slope may be the greatest at a first point P1 between the front surface S1 and the rear surface S2, for example, at a point separated by substantially the same distance from the front surface S1 and the rear surface S2, and the modulus variation slope may decrease gradually, as further away from the first point P1.

The modulus of the adhesive layer PSA3 at the front surface S1 may be about 100 Kpa or higher and about 1000 Kpa or lower, and the modulus of the adhesive layer PSA3 at the rear surface S2 may be about 100 Kpa or lower. A difference between the modulus of the adhesive layer PSA3 at the front surface S1 and the modulus of the adhesive layer PSA3 at the rear surface S2 may be about 100 Kpa or greater.

The adhesive layer PSA3 has a higher bending stiffness at the front surface S1 than that at the rear surface S2. The adhesive layer PSA3 may have a bending stiffness that decreases gradually in the first direction D1. The bending stiffness of the adhesive layer PSA3 at the front surface S1 may be about 30 N·cm or higher and about 50 N·cm or lower, and the bending stiffness of the adhesive layer PSA3 at the rear surface S2 may be about 15 N·cm or higher and about 30 N·cm or lower. A difference between the bending stiffness of the adhesive layer PSA3 at the front surface S1 and the bending stiffness of the adhesive layer PSA3 at the rear surface S2 may be about 15 N·cm or greater.

The front surface S1 of the adhesive layer PSA3 having a relatively high modulus and a relatively high bending stiffness may prevent or at least reduce the cover member CM, or the window of the cover member CM from being damaged when the display device is folded, and the rear surface S2 of the adhesive layer PSA3 having a relatively low modulus and a relatively low bending stiffness may prevent or at least reduce bright spots from being generated by an impact applied to the display panel DP. Also, since the adhesive layer PSA3 forms a single layer, the manufacturing process of the display device may be reduced (simplified). In addition, since the single adhesive layer PSA3 may prevent or at least reduce reflection or refraction of light that may occur at an interface between a plurality of adhesive layers such as adhesive layers PSA1 and PSA2 of FIG. 6, the image quality of the display device may be improved. In addition, given that a plurality of adhesive layers may peel off from each other, the single adhesive layer PSA3 may be robust to stress.

Figure 10:
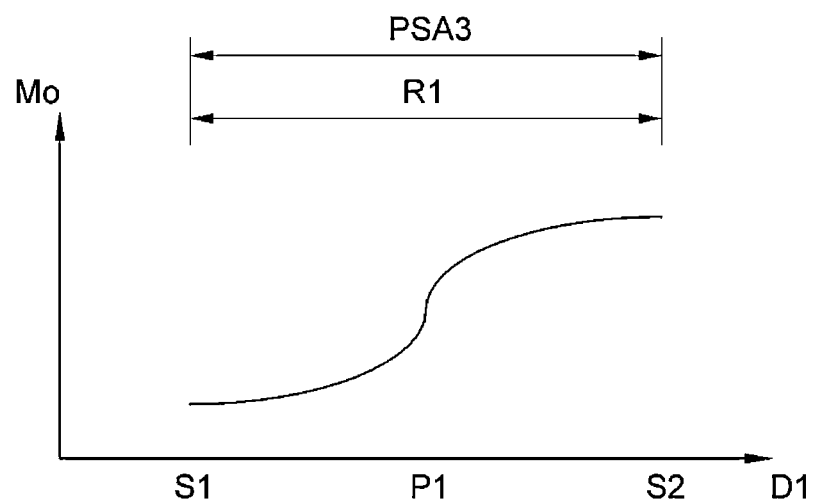

Referring to FIG. 10, the front surface S1 of the adhesive layer PSA3 has a modulus lower than that of the rear surface S2. The adhesive layer PSA3 may have a modulus that increases gradually in the first direction D1. The modulus of the adhesive layer PSA3 at the front surface S1 may be about 100 Kpa or lower, and the modulus of the adhesive layer PSA3 at the rear surface S2 may be about 100 Kpa or higher and about 1000 Kpa or lower. A difference between the modulus of the adhesive layer PSA3 at the front surface S1 and the modulus of the adhesive layer PSA3 at the rear surface S2 may be about 100 Kpa or greater.

The adhesive layer PSA3 has a lower bending stiffness at the front surface S1 than that at the rear surface S2. The adhesive layer PSA3 may have a bending stiffness that increases gradually in the first direction D1. The bending stiffness of the adhesive layer PSA3 at the rear surface S2 may be about 30 N·cm or higher and about 50 N·cm or lower, and the bending stiffness of the adhesive layer PSA3 at the front surface S1 may be about 15 N·cm or higher and about 30 N·cm or lower. A difference between the bending stiffness of the adhesive layer PSA3 at the front surface S1 and the bending stiffness of the adhesive layer PSA3 at the rear surface S2 may be about 15 N·cm or greater.

Figure 11:
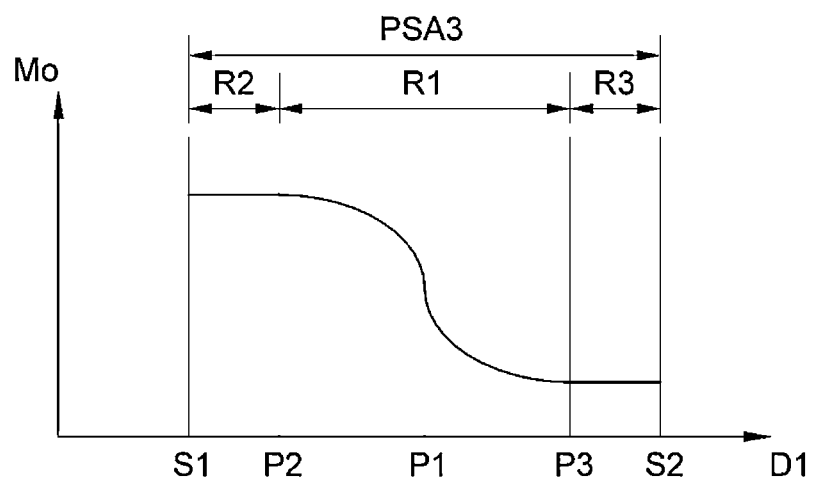

Referring to FIG. 11, the front surface S1 of the adhesive layer PSA3 has a modulus or bending stiffness higher than that of the rear surface S2. The adhesive layer PSA3 may have a substantially constant modulus or bending stiffness at the second region R2 from the front surface S1 to the second point P2. The adhesive layer PSA3 may have a modulus or bending stiffness that decreases gradually in the first direction D1 at the first region R1 from the second point P2 to a third point P3. The adhesive layer PSA3 may have a substantially constant modulus or bending stiffness at a third region R3 from the third point P3 to the rear surface S2. The adhesive layer PSA3 has a continuous modulus or bending stiffness throughout the entire regions R1, R2, and R3 of the adhesive layer PSA3.

The modulus of the adhesive layer PSA3 at the second region R2 may be about 100 Kpa or higher and about 1000 Kpa or lower, and the modulus of the adhesive layer PSA3 at the third region R3 may be about 100 Kpa or lower. A difference between the modulus of the adhesive layer PSA3 at the second region R2 and the modulus of the adhesive layer PSA3 at the third region R3 may be about 100 Kpa or greater.

The bending stiffness of the adhesive layer PSA3 at the second region R2 may be about 30 N·cm or higher and about 50 N·cm or lower, and the bending stiffness of the adhesive layer PSA3 at the third region R3 may be about 15 N·cm or higher and about 30 N·cm or lower. A difference between the bending stiffness of the adhesive layer PSA3 at the second region R2 and the bending stiffness of the adhesive layer PSA3 at the third region R3 may be about 15 N·cm or greater.

Figure 12:
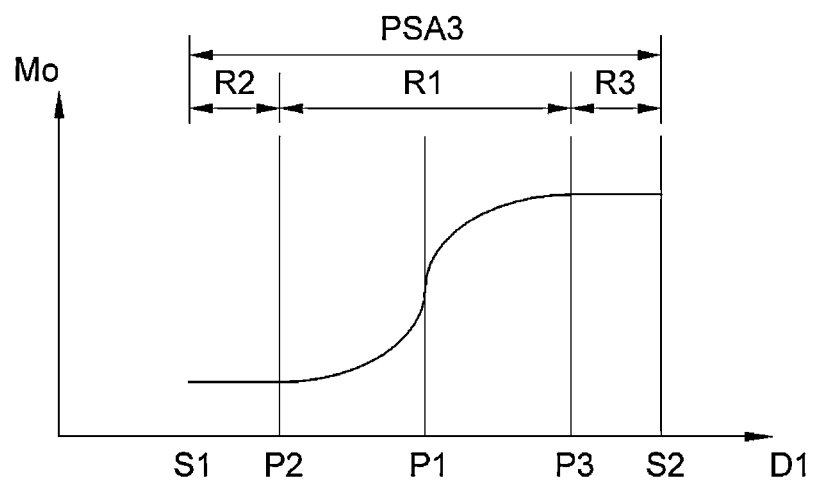

Referring to FIG. 12, the front surface S1 of the adhesive layer PSA3 has a modulus or bending stiffness lower than that of the rear surface S2. The adhesive layer PSA3 may have a substantially constant modulus or bending stiffness at the second region R2 from the front surface S1 to the second point P2. The adhesive layer PSA3 may have a modulus or bending stiffness that increases gradually in the first direction D1 at the first region R1 from the second point P2 to the third point P3. The adhesive layer PSA3 may have a substantially constant modulus or bending stiffness at the third region R3 from the third point P3 to the rear surface S2. The adhesive layer PSA3 has a continuous a modulus or bending stiffness throughout the entire regions R1, R2, and R3 of the adhesive layer PSA3.

The modulus of the adhesive layer PSA3 at the second region R2 may be about 100 Kpa or lower, and the modulus of the adhesive layer PSA3 at the third region R3 may be about 100 Kpa or higher and about 1000 Kpa or lower. A difference between the modulus of the adhesive layer PSA3 at the second region R2 and the modulus of the adhesive layer PSA3 at the third region R3 may be about 100 Kpa or greater.

The bending stiffness of the adhesive layer PSA3 at the second region R2 may be about 15 N·cm or higher and about 30 N·cm or lower, and the bending stiffness of the adhesive layer PSA3 at the third region R3 may be about 30 N·cm or higher and about 50 N·cm or lower. A difference between the bending stiffness of the adhesive layer PSA3 at the second region R2 and the bending stiffness of the adhesive layer PSA3 at the third region R3 may be about 15 N·cm or greater.

Figure 13:
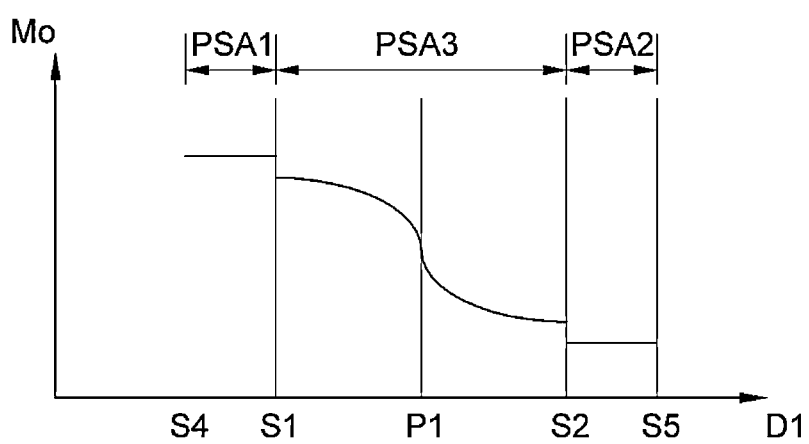
FIG. 13 is a graph illustrating a modulus of another embodiment of a plurality of adhesive layer.

FIG. 13 is a graph illustrating a modulus of another embodiment of a plurality of adhesive layer.

Referring to FIG. 13, a plurality of adhesive layers PAS1, PSA2, and PSA3 may be provided between the cover member CM and the display panel DP of FIG. 1. The third adhesive layer PSA3 may be disposed between the first adhesive layer PSA1 and the second adhesive layer PSA2. The third adhesive layer PSA3 may be the adhesive layer PSA3 illustrated with reference to FIGS. 8 to 12. The first adhesive layer PSA1 and the second adhesive layer PSA2 form interfaces S1 and S2 with the third adhesive layer PSA3. A front surface S4 of the first adhesive layer PSA1 may directly contact the cover member CM, or the window of the cover member CM. A rear surface S5 of the second adhesive layer PAS2 may directly contact the display panel DP, or the thin film encapsulation layer 350 of the display panel DP.

At the interface S1 between the first adhesive layer PSA1 and the third adhesive layer PSA3, and at the interface S2 between the second adhesive layer PSA2 and the third adhesive layer PSA3, a modulus or bending stiffness of the adhesive layer PSA1, PSA2, and PSA3 may not be continuous. The modulus or bending stiffness of the first adhesive layer PSA1 may be higher than the modulus or bending stiffness of the third adhesive layer PSA3. The modulus or bending stiffness of the second adhesive layer PSA2 may be lower than the modulus or bending stiffness of the third adhesive layer PSA3. The first adhesive layer PSA1 and the second adhesive layer PSA2 may each have a substantially constant modulus in the first direction D1 which is the thickness direction.

Figure 14:
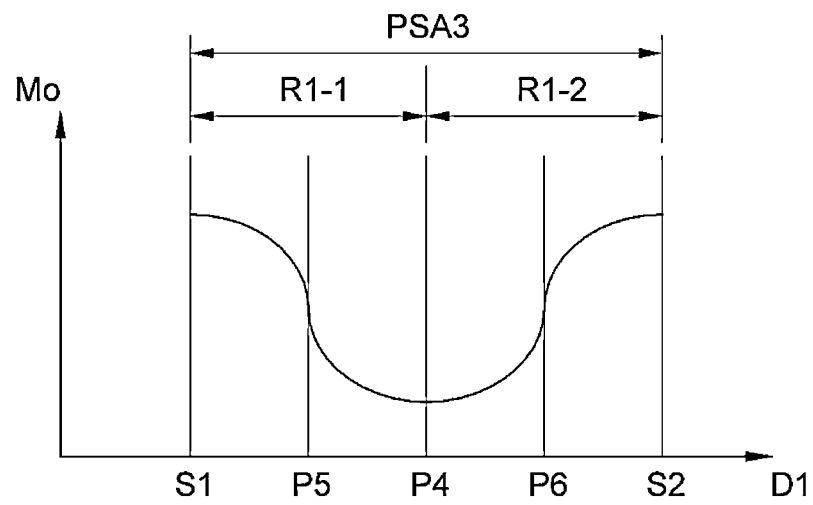
FIGS. 14 to 16 are graphs illustrating moduli of other embodiments of an adhesive layer.
Figure 15:
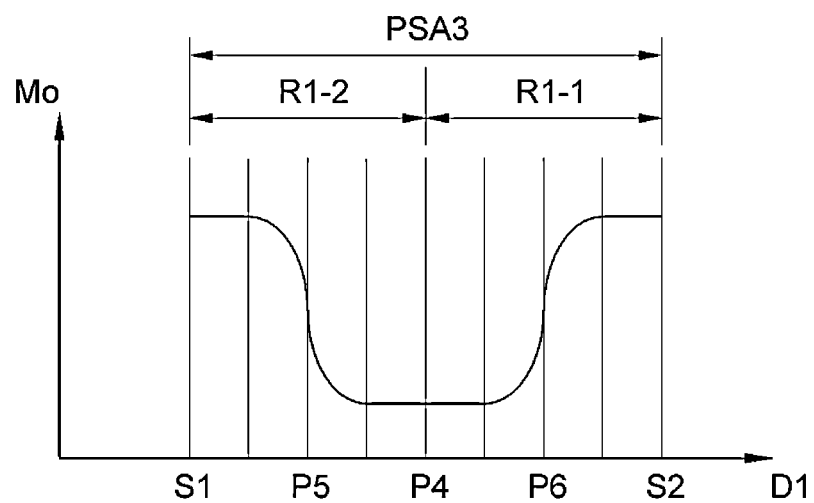
Figure 16:
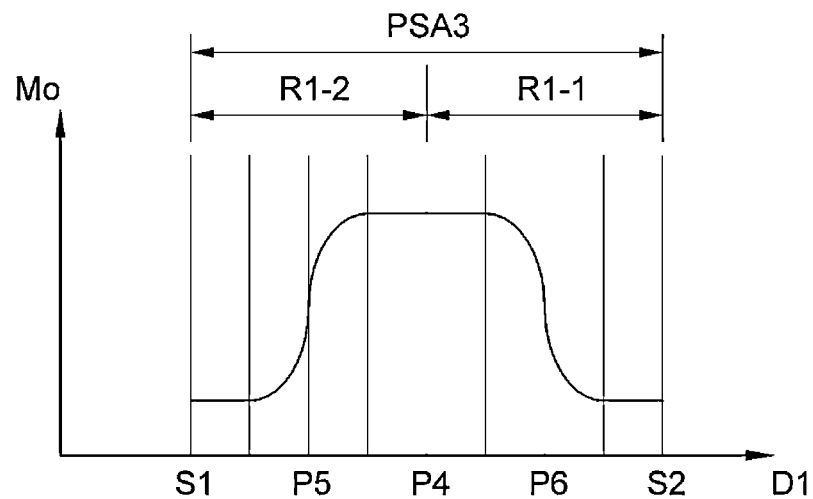

FIGS. 14 to 16 are graphs illustrating moduli of other embodiments of an adhesive layer.

Referring to FIG. 14, the front surface S1 and the rear surface S2 of the adhesive layer PSA3 have moduli or bending stiffnesses higher than the modulus or bending stiffness of a fourth point P4 therebetween. The adhesive layer PSA3 may have a modulus or bending stiffness that decreases gradually in the first direction D1 at a (1-1)-th region R1-1 from the front surface S1 to the fourth point P4. The adhesive layer PSA3 may have a modulus or bending stiffness that increases gradually in the first direction D1 at a (1-2)-th region R1-2 from the fourth point P4 to the rear surface S2. A modulus variation slope may be the greatest at a fifth point P5 between the front surface S1 and the fourth point P4 and at a sixth point P6 between the rear surface S2 and the fourth point P4, and may decrease gradually, as further away from the fifth point P5 and the sixth point P6.

The modulus of the adhesive layer PSA3 at the front surface S1 and the rear surface S2 may be about 100 Kpa or higher and about 1000 Kpa or lower, and the modulus of the adhesive layer PSA3 at the fourth point P4 may be about 100 Kpa or lower. A difference between the modulus of the adhesive layer PSA3 at the front surface S1 and the rear surface S2 and the modulus of the adhesive layer PSA3 at the fourth point P4 may be about 100 Kpa or greater.

The bending stiffness of the adhesive layer PSA3 at the front surface S1 and the rear surface S2 may be about 30 N·cm or higher and about 50 N·cm or lower, and the bending stiffness of the adhesive layer PSA3 at the fourth point P4 may be about 15 N·cm or higher and about 30 N·cm or lower. A difference between the bending stiffness of the adhesive layer PSA3 at the front surface S1 and the rear surface S2 and the bending stiffness of the adhesive layer PSA3 at the fourth point P4 may be about 15 N·cm or greater.

Referring to FIG. 15, the front surface S1 and the rear surface S2 of the adhesive layer PSA3 have a modulus or bending stiffness higher than that of the fourth point P4 therebetween. The adhesive layer PSA3 may have a substantially constant modulus or bending stiffness, within a predetermined distance from the front surface S1, and within a predetermined distance from the fourth point P4, and within a predetermined distance from the rear surface S2.

Referring to FIG. 16, the front surface S1 and the rear surface S2 of the adhesive layer PSA3 have a modulus or bending stiffness lower than that of the fourth point P4 therebetween. The adhesive layer PSA3 may have a modulus or bending stiffness that decreases gradually in the first direction D1 at the (1-1)-th region R1-1 from the fourth point P4 to the rear surface S2. The adhesive layer PSA3 may have a modulus or bending stiffness that increases gradually in the first direction D1 at the (1-2)-th region R1-2 from the front surface S1 to the fourth point P4. A modulus variation slope is the greatest at the fifth point P5 between the front surface S1 and the fourth point P4 and at the sixth point P6 between the rear surface S2 and the fourth point P4, and may decrease gradually, as further away from the fifth point P5 and the sixth point P6.

The modulus of the adhesive layer PSA3 at the front surface S1 and the rear surface S2 may be about 100 Kpa or lower, and the modulus of the adhesive layer PSA3 at the fourth point P4 may be about 100 Kpa or higher and about 1000 Kpa or lower. A difference between the modulus of the adhesive layer PSA3 at the front surface S1 and the rear surface S2 and the modulus of the adhesive layer PSA3 at the fourth point P4 may be about 100 Kpa or greater.

The bending stiffness of the adhesive layer PSA3 at the front surface S1 and the rear surface S2 may be about 15 N·cm or higher and about 30 N·cm or lower, and the bending stiffness of the adhesive layer PSA3 at the fourth point P4 may be about 30 N·cm or higher and about 50 N·cm or lower. A difference between the bending stiffness of the adhesive layer PSA3 at the front surface S1 and the rear surface S2 and the bending stiffness of the adhesive layer PSA3 at the fourth point P4 may be about 15 N·cm or greater.

The adhesive layer PSA3 may have a substantially constant modulus or bending stiffness, within a predetermined distance from the front surface S1, within a predetermined distance from the fourth point P4, and within a predetermined distance from the rear surface S2.

Figure 17:
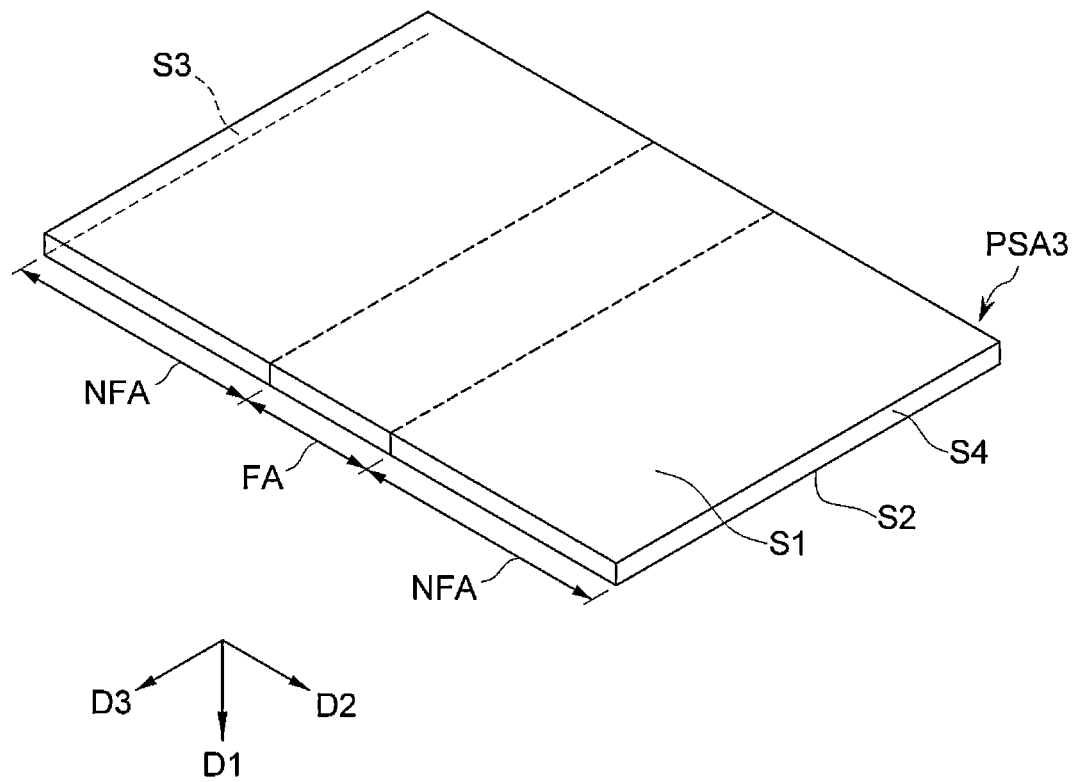
FIG. 17 is a perspective view of another embodiment of an adhesive layer.
Figure 18:
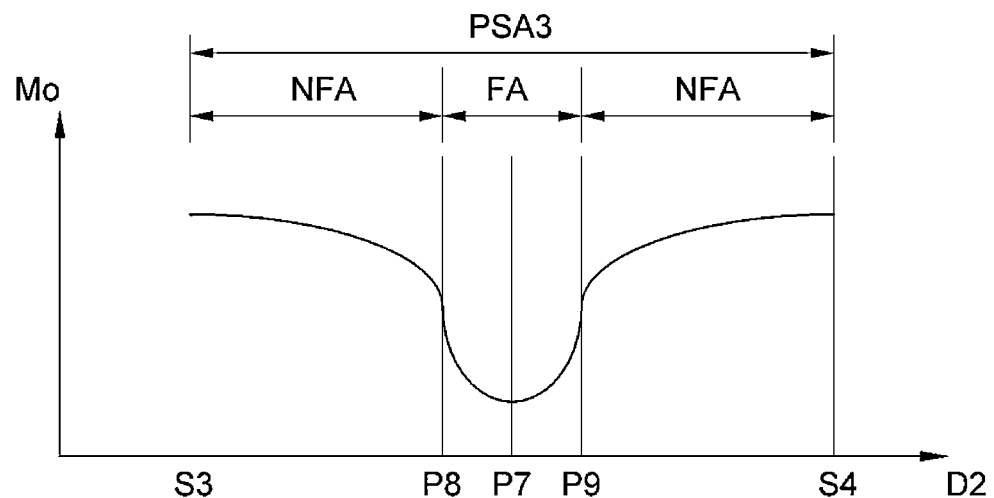
FIGS. 18 to 20 are graphs illustrating moduli of still other embodiments of an adhesive layer.
Figure 19:
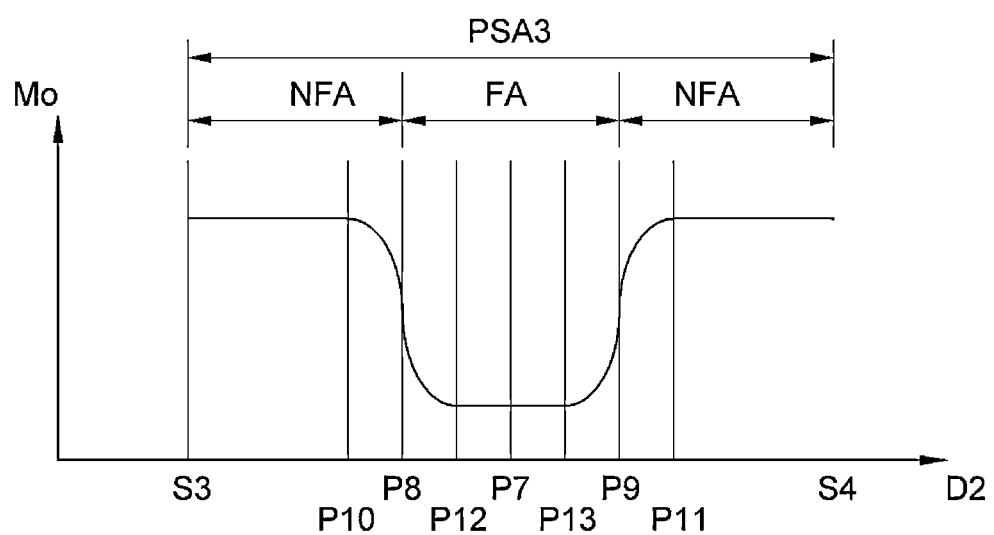
Figure 20:
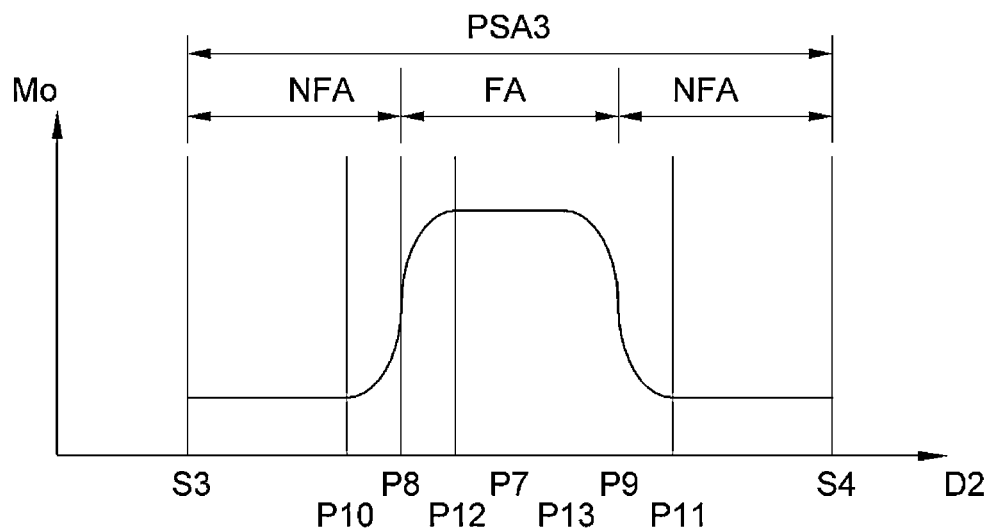

FIG. 17 is a perspective view of another embodiment of an adhesive layer. FIGS. 18 to 20 are graphs illustrating moduli of still other embodiments of an adhesive layer. In FIGS. 18 to 20, a vertical axis denotes a modulus or bending stiffness, and a horizontal axis denotes a position in the second direction D2.

Referring to FIGS. 1 and 17, the folding line FL, along which the display device DD is folded, may pass through the center of the display device DD and may be parallel to the third direction D3. Accordingly, the display device DD, the display panel DP, the cover member CM, and the adhesive layer PSA3 have a folding area FA adjacent to the folding line FL and the non-folding area NFA on opposite sides of the folding area FA.

The adhesive layer PAS3 may be disposed between the cover member CM and the display panel DP. The adhesive layer PAS3 has a front surface S1 facing the cover member CM and a rear surface S2 facing the display panel DP. The front surface S1 of the adhesive layer PSA3 may directly contact the cover member CM, or the window of the cover member CM. The rear surface S2 of the adhesive layer PAS3 may directly contact the display panel DP, or the thin film encapsulation layer 350 of the display panel DP. The adhesive layer PAS3 forms a single layer without an interface between the front surface S1 and the rear surface S2. The adhesive layer PSA3 has side surfaces S3 and 34 extending between the front surface S1 and the rear surface S2. A first side surface S3 and a second side surface S4 may extend in the third direction D3 crossing the second direction D2. The first side surface S3 and the second side surface S4 may be shaped to be parallel to the folding line FL. An interface may not be present between the first side surface S3 and the second side surface S4 of the adhesive layer PSA3.

Referring to FIG. 18, the folding area FA of the adhesive layer PSA3 has a modulus or bending stiffness lower than that of the non-folding area NFA. The adhesive layer PSA3 may have a modulus or bending stiffness that decreases gradually from the first side surface S3 toward a seventh point P7, which corresponds to the folding line FL. The adhesive layer PSA3 may have a modulus or bending stiffness that increases gradually from the seventh point P7 to the second side surface S4. The modulus variation slope may be the greatest at an eighth point P8 between the first side face S3 and the seventh point P7 and at a ninth point P9 between the second side face S4 and the seventh point P7, and may decrease gradually, as further away from the eighth and ninth points P8 and P9. The eighth and ninth points P8 and P9 may correspond to a boundary between the folding area FA and the non-folding area NFA.

The modulus of the adhesive layer PSA3 at the non-folding area NFA may be about 100 Kpa or higher and about 1000 Kpa or lower, and the modulus of the adhesive layer PSA3 at the folding area FA may be about 100 Kpa or lower. A difference between the modulus of the adhesive layer PSA3 at the non-folding area NFA and the modulus of the adhesive layer PSA3 at the folding area FA may be about 100 Kpa or greater.

The modulus of the adhesive layer PSA3 at the first and second side surfaces S3 and S4 may be about 100 Kpa or higher and about 1000 Kpa or lower, and the modulus of the adhesive layer PSA3 at the seventh point P7 may be about 100 Kpa or lower. A difference between the modulus of the adhesive layer PSA3 at the first and second side surfaces S3 and S4 and the modulus of the adhesive layer PSA3 at the seventh point P7 may be about 100 Kpa or greater.

The bending stiffness of the adhesive layer PSA3 at the non-folding area NFA may be about 30 N·cm or higher and about 50 N·cm or lower, and the bending stiffness of the adhesive layer PSA3 at the folding area FA may be about 15 N·cm or higher and about 30 N·cm or lower. A difference between the bending stiffness of the adhesive layer PSA3 at the non-folding area NFA and the bending stiffness of the adhesive layer PSA3 at the folding area FA may be about 15 N·cm or greater.

The bending stiffness of the adhesive layer PSA3 at the first and second side surfaces S3 and S4 may be about 30 N·cm or higher and about 50 N·cm or lower, and the bending stiffness of the adhesive layer PSA3 at the seventh point P7 may be about 15 N·cm or higher and about 30 N·cm or lower. A difference between the bending stiffness of the adhesive layer PSA3 at the first and second side surfaces S3 and S4 and the bending stiffness of the adhesive layer PSA3 at the seventh point P7 may be about 15 N·cm or greater.

Referring to FIG. 19, the adhesive layer PSA3 may have a substantially constant modulus or bending stiffness, within a predetermined distance from the first side surface S3, within a predetermined distance from the seventh point P7, and within a predetermined distance from the second side surface S4. More specifically, the adhesive layer PSA3 may have a substantially constant modulus or bending stiffness from the first side surface S3 to a tenth point P10. From the tenth point P10 to a twelfth point P12, the adhesive layer PSA3 may have a modulus or bending stiffness that decreases gradually. From the twelfth point P12 to a thirteenth point P13, the adhesive layer PSA3 may have a substantially constant modulus or bending stiffness. From the thirteenth point P13 to an eleventh point P11, the adhesive layer PSA3 may have a modulus or bending stiffness that increases gradually. From the eleventh point P11 to the second side surface S4, the adhesive layer PSA3 may have a substantially constant modulus or bending stiffness.

The adhesive layer PSA3 having a relatively high modulus and a relatively high bending stiffness at the non-folding area NFA may improve impact resistance of the display device DD. The adhesive layer PSA3 having a relatively low modulus and a relatively low bending stiffness at the folding area FA may relieve stress generated due to the folding of the display device DD. Also, the single adhesive layer PSA3 may enable the manufacturing process of the display device to be reduced. In addition, since the single adhesive layer PSA3 may prevent or at least reduce reflection or refraction of light that may occur at an interface between a plurality of adhesive layers, the image quality of the display device may be improved.

Referring to FIG. 20, the folding area FA of the adhesive layer PSA3 has a modulus or bending stiffness higher than that of the non-folding area NFA. The adhesive layer PSA3 may have a modulus or bending stiffness that increases gradually from the first side surface S3 to the seventh point P7, which corresponds to the folding line FL. The adhesive layer PSA3 may have a modulus or bending stiffness that decreases gradually from the seventh point P7 to the second side surface S4.

The modulus of the adhesive layer PSA3 at the folding area FA may be about 100 Kpa or higher and about 1000 Kpa or lower, and the modulus of the adhesive layer PSA3 at the non-folding area NFA may be about 100 Kpa or lower. A difference between the modulus of the adhesive layer PSA3 at the folding area FA and the modulus of the adhesive layer PSA3 at the non-folding area NFA may be about 100 Kpa or greater.

The modulus of the adhesive layer PSA3 at the seventh point P7 may be about 100 Kpa or higher and about 1000 Kpa or lower, and the modulus of the adhesive layer PSA3 at the first and second side surfaces S3 and S4 may be about 100 Kpa or lower. A difference between the modulus of the adhesive layer PSA3 at the first and second side surfaces S3 and S4 and the modulus of the adhesive layer PSA3 at the seventh point P7 may be about 100 Kpa or greater.

The bending stiffness of the adhesive layer PSA3 at the folding area FA may be about 30 N·cm or higher and about 50 N·cm or lower, and the bending stiffness of the adhesive layer PSA3 at the non-folding area NFA may be about 15 N·cm or higher and about 30 N·cm or lower. A difference between the bending stiffness of the adhesive layer PSA3 at the non-folding area NFA and the bending stiffness of the adhesive layer PSA3 at the folding area FA may be about 15 N·cm or greater.

The bending stiffness of the adhesive layer PSA3 at the seventh point P7 may be about 30 N·cm or higher and about 50 N·cm or lower, and the bending stiffness of the adhesive layer PSA3 at the first and second side surfaces S3 and S4 may be about 15 N·cm or higher and about 30 N·cm or lower. A difference between the bending stiffness of the adhesive layer PSA3 at the seventh point P7 and the bending stiffness of the adhesive layer PSA3 at the first and second side surfaces S3 and S4 may be about 15 N·cm or greater.

Referring to FIG. 20, the adhesive layer PSA3 may have a substantially constant modulus or bending stiffness, within a predetermined distance from the first side surface S3, within a predetermined distance from the seventh point P7, and within a predetermined distance from the second side surface S4. More specifically, the adhesive layer PSA3 may have a substantially constant modulus or bending stiffness from the first side surface S3 to the tenth point P10, from the twelfth point P12 to a thirteenth point P13, and from the eleventh point P11 to the second side surface S4.

The third adhesive layer PSA3 having a relatively low modulus and a relatively low bending stiffness at the non-folding area NFA may substantially prevent bright spots from being generated by an impact applied to the display panel DP. The third adhesive layer PSA3 having a relatively high modulus and a relatively high bending stiffness at the folding area FA may substantially prevent or at least reduce buckling due to shearing forces of the adhesive layer PSA3, that may be generated when the display device DD is folded, overlapping at some areas of the display device DD such as the non-folding area NFA. Thus, the display device DD may not be deformed. Also, the single adhesive layer PSA3 may enable the manufacturing process of the display device to be simplified. In addition, since the single adhesive layer PSA3 may prevent or at least reduce reflection or refraction of light that may occur at an interface between a plurality of adhesive layers, the image quality of the display device may be improved.

FIGS. 21 to 28 are graphs each illustrating a concentration of an initiator included in a composition before curing an adhesive layer according to embodiments. In FIGS. 21 to 28, a vertical axis denotes a concentration of an initiator, and a horizontal axis denotes a position in the first direction D1.

In an embodiment, the adhesive layer PSA3 may be formed by curing a photocurable composition including a photocurable resin. The photocurable resin, more specifically, an ultraviolet (UV)-curable resin, includes a polymer material system or a composition system that causes physical and chemical changes by a light energy. Photocuring may include photopolymerization in which monomers or photosensitive polymers (i.e., prepolymers) become polymers, or optical crosslinking in which polymers are converted into three-dimensional crosslinked polymers by a crosslinking reaction.

The UV-curable composition may include a prepolymer, a polyfunctional monomer (which is a diluent), and a photoinitiator component, and may generally include 50 to 60% of a polymer, 30 to 40% of a multifunctional monomer, and 1 to 10% of a photoinitiator.

The polyfunctional monomer serves as a diluent for the UV-curable composition to reduce the viscosity and becomes part of a cured structure after curing. The polyfunctional monomer may include a monofunctional, bifunctional or polyfunctional acrylic system.

The prepolymer is a main component constituting the skeleton of the UV-curable composition, and determines the physical properties (hardness, adhesion, electrical properties, flexibility, chemical resistance, etc.) of the adhesive layer PSA3. The prepolymer may include at least one selected from the group consisting of unsaturated polyester resins, polyester acrylate resins, polyurethane acrylate resins, and epoxy acrylate resins.

The photoinitiator, more specifically, the UV initiator, is added to the UV-curable resin in a small amount, and initiates a polymerization reaction upon receiving UV rays emitted from a UV lamp.

The photocuring reaction may be affected by the light intensity, the wavelength of the light, the irradiation time of the light, the thickness of the composition, the type of the initiator, the concentration, and the like.

According to an embodiment, the composition for forming the adhesive layer PSA3 includes at least one photoinitiator having a different concentration in the first direction D1.

Figure 21:
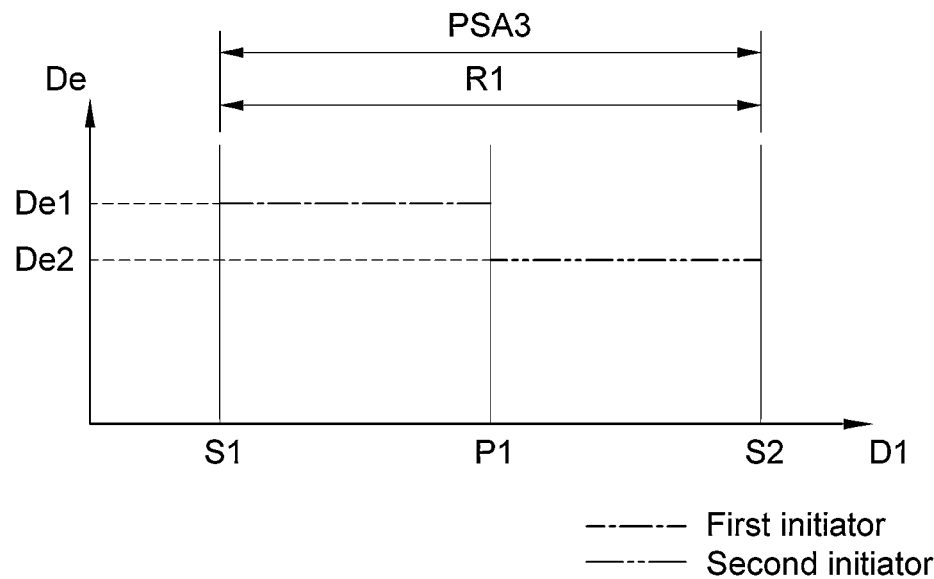
FIGS. 21 to 28 are graphs each illustrating a concentration of an initiator before curing an adhesive layer according to embodiments.

Referring to FIG. 21, a photocurable composition (hereinafter, a "composition") may include a first composition applied from the front surface S1 to the first point P1 and a second composition applied from the first point P1 to the rear surface S2.

The first composition includes a photocurable resin (hereinafter, a "resin") and a first photoinitiator (hereinafter, an "initiator"). A second composition includes a resin and a second photoinitiator (hereinafter, an "initiator"). The first composition and the second composition may include substantially the same resin. The first initiator and the second initiator initiate the polymerization reaction with light having a first wavelength and light having a second wavelength, respectively. The first wavelength and the second wavelength may be different from each other. The first initiator initiates the polymerization reaction by the light having the first wavelength, but does not initiate the polymerization reaction by the light having the second wavelength. The second initiator initiates the polymerization reaction by the light having the second wavelength, but does not initiate the polymerization reaction by the light having the first wavelength.

A short wavelength initiator initiates the polymerization reaction by light having a short wavelength in a range from about 220 nm to about 320 nm, but does not initiate the polymerization reaction by light having a wavelength of about 320 nm or more. An intermediate wavelength initiator initiates the polymerization reaction by light having an intermediate wavelength in a range from about 260 nm to about 380 nm, but does not initiate the polymerization reaction by light having a wavelength of about 380 nm or more. A long wavelength initiator initiates the polymerization reaction by light having a long wavelength in a range from about 340 nm to about 440 nm, but does not initiate the polymerization reaction by light having a wavelength of about 440 nm or more.

The first initiator may include any one of the short wavelength, the intermediate wavelength and the long wavelength initiators, and the second initiator may include another of the short wavelength, the intermediate wavelength and the long wavelength initiators.

For example, an initiator having an active wavelength band of a relatively short wavelength may include, for example, IRGACURE® 184, 250, 369, 500, 651, 754, 907, 1300, 2959, DAROCUR® 1173, and MBF, while an initiator having an active wavelength band of a relatively long wavelength may include, for example, IRGACURE® 784, 819, 2022, 2100, and DAROCUR® TPO.

Referring to FIG. 21, the first initiator has a concentration of De1 from the front surface S1 to the first point P1, and is not included from the first point P1 to the rear surface S2. The second initiator is not included from the front surface S1 to the first point P1, and has a concentration of De2 from the first point P1 to the rear surface S2. De1 and De2 may be substantially the same as each other or may be different from each other.

Figure 22:
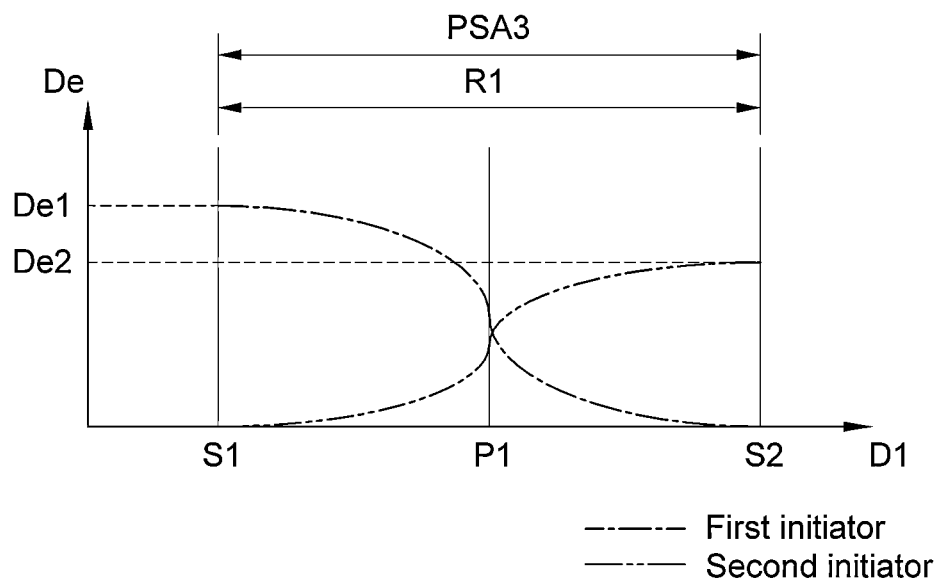

Referring to FIG. 22, the first initiator has a concentration of De1 at the front surface S1, and the concentration decreases, as closer to the rear surface S2. The second initiator has a concentration of De2 at the rear surface S2, and the concentration decreases, as closer to the front surface S1. The concentrations of De1 and De2 may be substantially the same as each other or may be different from each other. The first initiator and the second initiator may each have a substantially constant concentration adjacent to the front surface S1 and the rear surface S2.

The concentration graph of FIG. 21 may correspond to a state immediately after the application of the first composition and the second composition, and FIG. 22 may correspond to a state in which the first initiator and the second initiator are each diffused beyond the first point P1 after the application of the first composition and the second composition.

Referring to FIGS. 21 and 22, curing of an area adjacent to the front surface S1 is mainly affected by the first initiator, and curing of an area adjacent to the rear surface S2 is mainly affected by the second initiator. Accordingly, the area adjacent to the front surface S1 may be cured by irradiating the area with light having the first wavelength that activates only the first initiator, and the area adjacent to the rear surface S2 may be cured by irradiating the area with light having the second wavelength that activates only the second initiator. In addition, the curing degree of the area adjacent to the front surface S1 may be determined according to intensity of the light having the first wavelength, an irradiation time of the light, and a concentration of the first initiator. In addition, independently from the curing degree of the area adjacent to the front surface S1, the curing degree of the area adjacent to the rear surface S2 may be determined according to intensity of the light having the second wavelength, an irradiation time of the light, and a concentration of the second initiator. For example, they may be cured to have a modulus or bending stiffness illustrated with reference to FIGS. 8 to 12.

Figure 23:
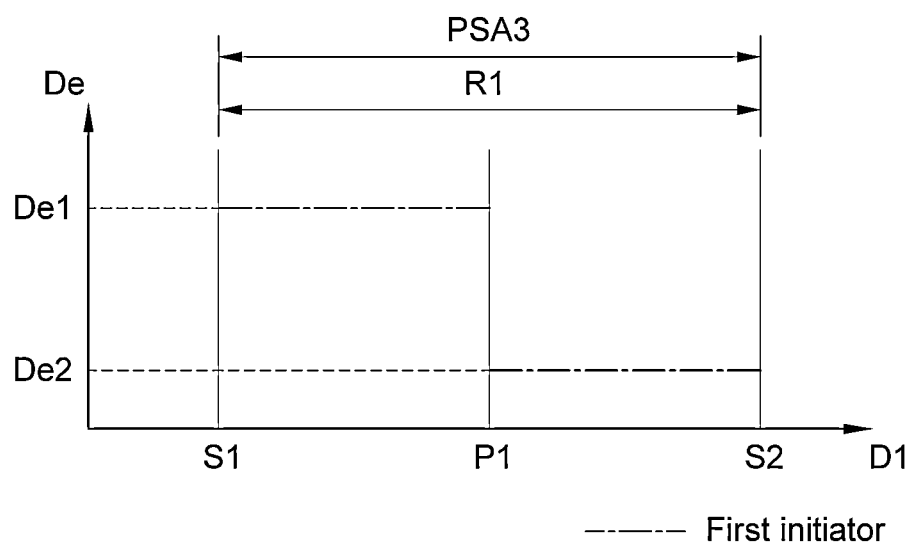

Referring to FIG. 23, the composition includes a first composition applied from the front surface S1 to the first point P1 and a second composition applied from the first point P1 to the rear surface S2.

The first composition includes a resin and a first initiator having a concentration of De1. The second composition includes a resin and the first initiator having a concentration of De2. The first composition and the second composition may include substantially the same resin. The concentrations of De1 and De2 of the first initiator in the first and second compositions are different from each other. Any one of the concentrations of De1 and De2 may be zero.

The first initiator has a concentration of De1 from the front surface S1 to the first point P1, and has a concentration of De2 from the first point P1 to the rear surface S2. The first initiator may not be included from the first point P1 to the rear surface S2. In contrast, the first initiator may not be included from the front surface S1 to the first point P1.

Figure 24:
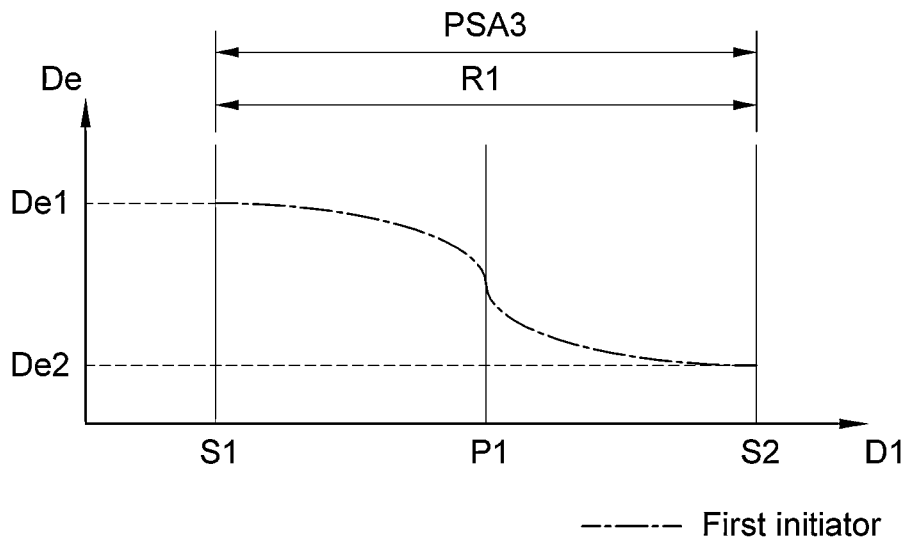

Referring to FIG. 24, the first initiator has a concentration of De1 at the front surface S1, and the concentration decreases, as closer to the rear surface S2. Accordingly, the first initiator may have a concentration of De2 at the rear surface S2. The first initiators may have a substantially constant concentration adjacent to the front surface S1 and rear surface S2.

The concentration graph of FIG. 23 may correspond to a state immediately after the application of the first composition and the second composition, and FIG. 24 may correspond to a state in which the first initiator is diffused beyond the first point P1 after the application of the first composition and the second composition.

Referring to FIGS. 23 and 24, the concentration of the first initiator varies along the first direction D1. Accordingly, the curing degree of the respective areas adjacent to the front surface S1 and the rear surface S2 may be different depending on the concentration of the first initiator. Generally, part having a relatively higher concentration of the initiator is cured to have a relatively higher modulus or bending stiffness. For example, it may be cured to have a modulus or bending stiffness illustrated in FIGS. 8 to 12.

Figure 25:
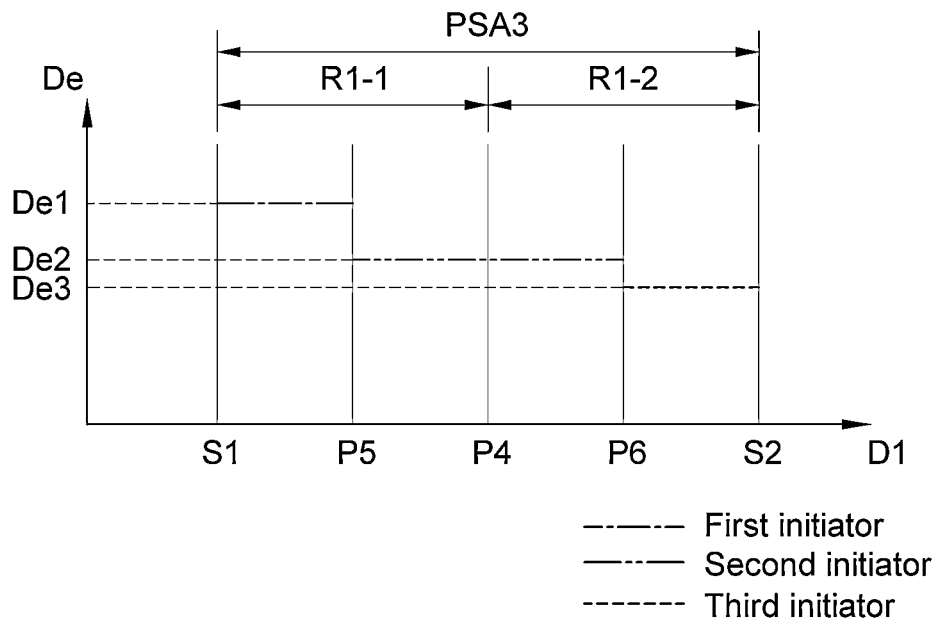

Referring to FIG. 25, the composition includes a first composition applied from the front surface S1 to the fifth point P5, a second composition applied from the fifth point P5 to the sixth point P6, and a third composition applied from the sixth point P6 to the rear surface S2.

The first composition includes a resin and a first initiator. The second composition includes a resin and a second initiator. The third composition includes a resin and a third initiator. The first composition, the second composition and the third composition may each include substantially the same resin. The first initiator, the second initiator, and the third initiator may have active wavelength bands different from each other.

For example, the first initiator may include any one of short, intermediate and long wavelength initiators, the second initiator may include another of the short, intermediate and long wavelength initiators, and the third initiator may include the other of the short, intermediate and long wavelength initiators.

Alternatively, the first initiator and the third initiator may have active wavelength bands different from that of the second initiator, and the first initiator and the third initiator may have substantially the same active wavelength band. The first initiator and the third initiator may include substantially the same material.

Referring to FIG. 25, the first initiator has a concentration of De1 from the front surface S1 to the fifth point P5 and is not included in the rest. The second initiator has a concentration of De2 from the fifth point P5 to the sixth point P6, and is not included in the rest. The third initiator has a concentration of De3 from the sixth point P6 to the rear surface S2 and is not included in the rest. The concentrations of De1, De2 and De3 may be substantially the same as each other or may be different from each other. The concentrations of De1 and De3 may be substantially the same as each other and may be different from the concentration of De2.

Figure 26:
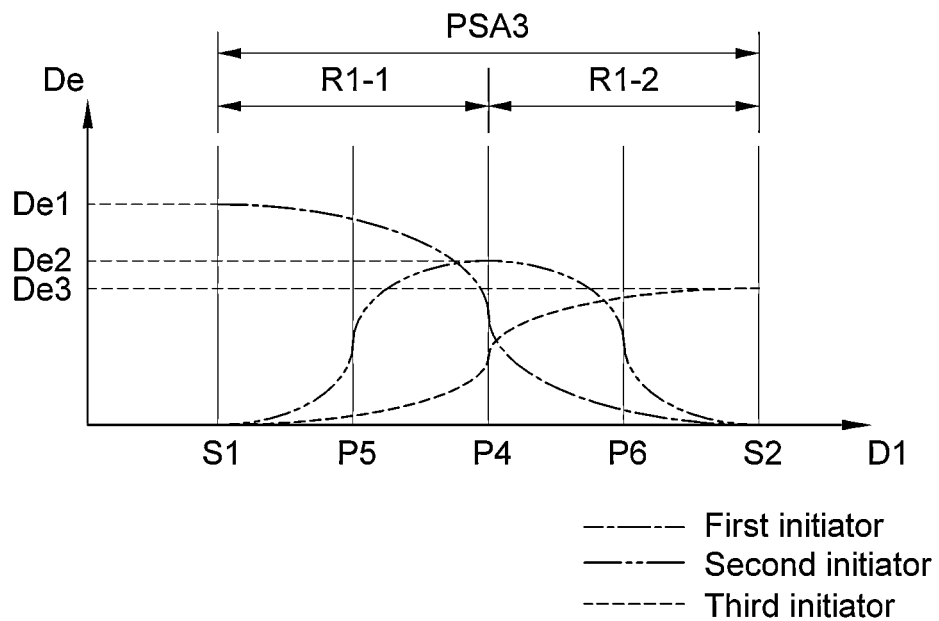

Referring to FIG. 26, the first initiator has a concentration of De1 at the front surface S1, and the concentration decreases, as closer to the rear surface S2. The second initiator has a concentration of De2 at the fourth point P4, and the concentration decreases, as closer to the front surface S1 or the rear surface S2. The third initiator has a concentration of De3 at the rear surface S2, and the concentration decreases, as closer to the front surface S1. The first initiator, the second initiator, and the third initiator may have a substantially constant concentration adjacent to the front surface S1, the fourth point P4, and the rear surface S2, respectively.

The concentration graph of FIG. 25 may correspond to a state immediately after the application of the first composition, the second composition and the third composition, and FIG. 26 may correspond to a state in which the first composition, the second composition, and the third composition are each diffused after the application of the first composition, the second composition and the third composition.

Referring to FIGS. 25 and 26, curing of an area adjacent to the front surface S1 is mainly affected by the first initiator, curing of an area adjacent to the fourth point P4 is mainly affected by the second initiator, and curing of an area adjacent to the rear surface S2 is mainly affected by the third initiator. Accordingly, the curing degree of the areas adjacent to the front surface S1, the fourth point P4 and the rear surface S2 may be independently determined. For example, they may be cured to have a modulus or bending stiffness illustrated in FIGS. 14 to 16. As such, the modulus or bending stiffness may be adjusted according to a position in the adhesive layer by adjusting a type and/or concentration of an initiator included in each composition.

Figure 27:
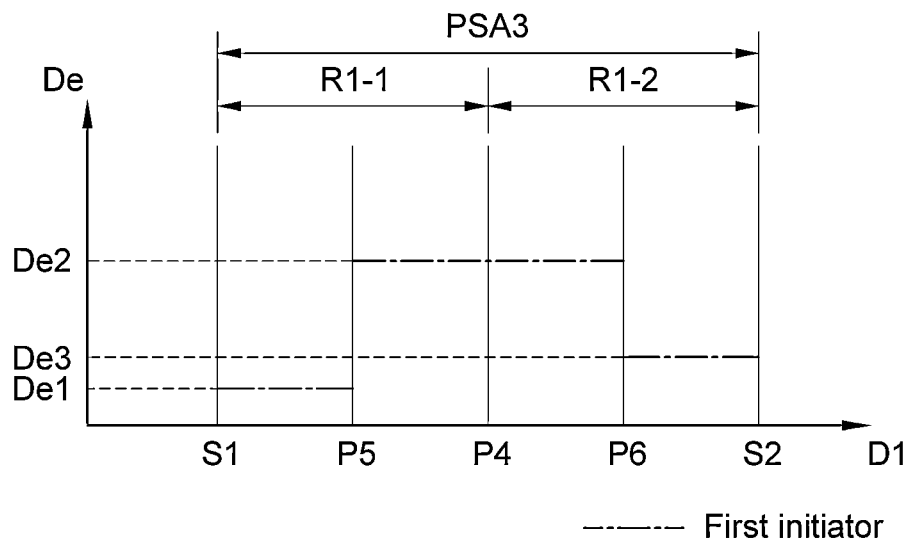

Referring to FIG. 27, the composition includes a first composition applied from the front surface S1 to the fifth point P5, a second composition applied from the fifth point P5 to the sixth point P6, and a third composition applied from the sixth point P6 to the rear surface S2.

The first composition includes a resin and a first initiator having a concentration of De1. The second composition includes a resin and the first initiator having a concentration of De2. The third composition includes a resin and the first initiator having a concentration of De3. The first, second, and third compositions may include substantially the same resin. The concentrations of De1 and De3 of the first initiator of the first and third compositions are different from the concentration of De2 of the first initiator of the second composition. The concentrations of De1 and De3 of the first initiator of the first and third compositions may be substantially the same as each other or different from each other. The concentrations of De1 and De3 of the first initiator of the first and third compositions may be zero. In contrast, the concentration of De2 of the first initiator of the second composition may be zero.

Referring to FIG. 27, the first initiator has a concentration of De1 from the front surface S1 to the fifth point P5, has a concentration of De2 from the fifth point P5 to the sixth point P6, and has a concentration of De3 from the sixth point P6 to the rear surface S2.

Figure 28:
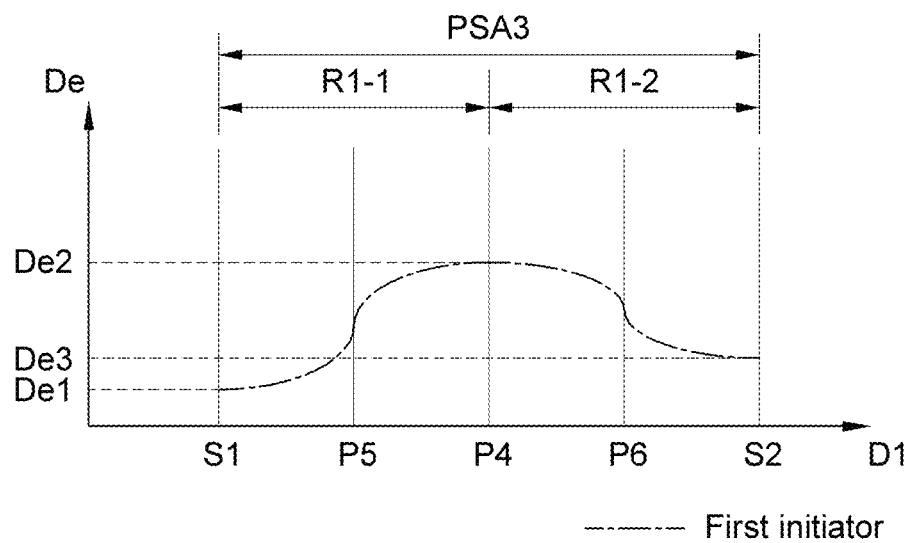

Referring to FIG. 28, the first initiator has a highest concentration of De2 at the fourth point P4, and the concentration decreases, as closer to the front surface S1 or the rear surface S2. However, embodiments are not limited thereto, and the first initiator may have a lowest concentration of De2 at the fourth point P4, and the concentration may increase, as closer to the front surface S1 or the rear surface S2.

The concentration graph of FIG. 27 may correspond to a state immediately after the application of the first, second, and third compositions, and FIG. 28 may correspond to a state in which the first composition is diffused after application of the first, second, and third compositions.

Referring to FIGS. 27 and 28, the concentration of the first initiator varies along the first direction D1. Accordingly, the curing degree of the area adjacent to the front surface S1, the fourth point P4, and the rear surface S2 may be different from each other depending on the concentration of the first initiator. For example, it may be cured to have a modulus or bending stiffness illustrated in FIGS. 14 to 16.

FIGS. 29A to 29G are cross-sectional views illustrating an embodiment of a method of manufacturing an adhesive layer.

Figure 29A:
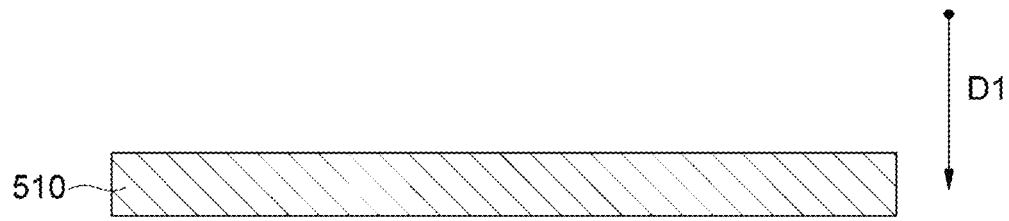
FIGS. 29A to 29G are cross-sectional views illustrating an embodiment of a method of manufacturing an adhesive layer.

Referring to FIG. 29A, a first release film 510 at which an adhesive layer is to be formed is prepared.

Figure 29B:
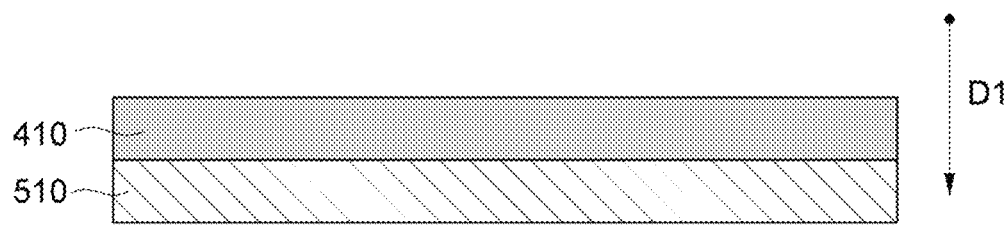

Referring to FIG. 29B, a first composition 410 is applied on the first release film 510. The first composition 410 may correspond to the first composition applied from the front surface S1 to the first point P1, described with reference to FIG. 21.

Figure 29C:
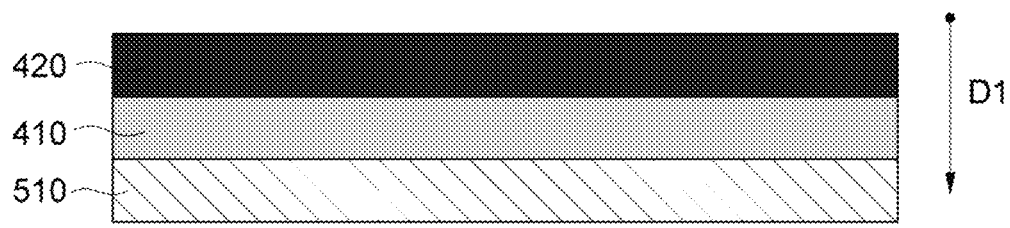

Referring to FIG. 29C, a second composition 420 is applied on the first composition 410. The second composition 420 may correspond to the second composition applied from the first point P1 to the rear surface S2, described with reference to FIG. 21.

Figure 29D:
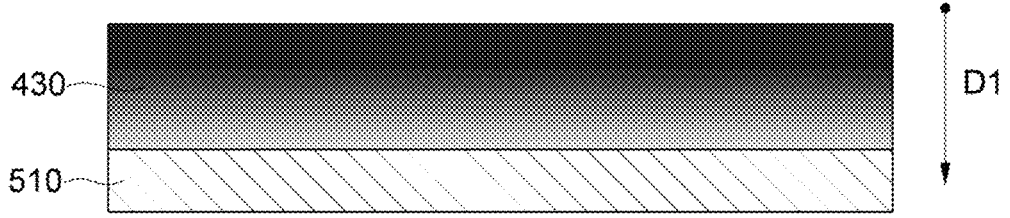

Referring to FIG. 29D, the first initiator included in the first composition 410 and the second initiator included in the second composition 420 are diffused such that the concentration of the first initiator and the second initiator varies gradually. The concentrations of the first initiator and the second initiator may correspond to those illustrated in FIG. 22.

Figure 29E:
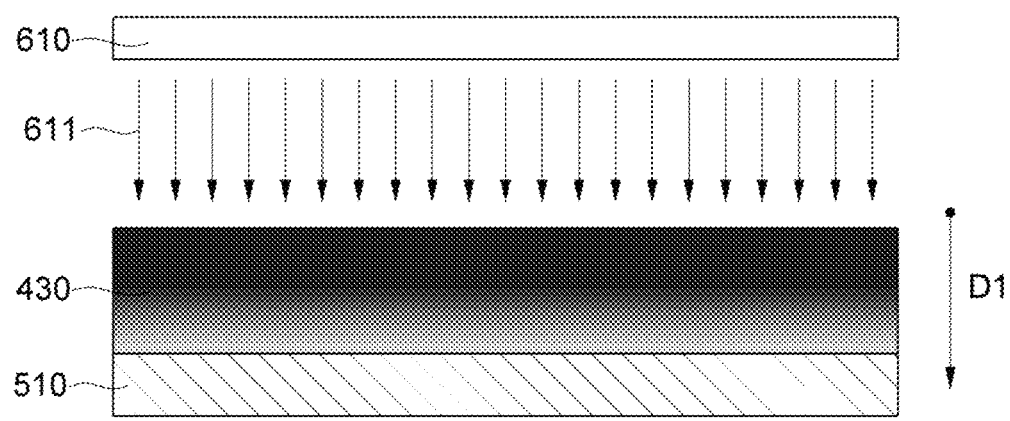

Referring to FIG. 29E, a UV lamp 610 emits a UV ray 611 to an uncured composition 430. Only the first initiator initiates the polymerization reaction by the UV ray 611 having the first wavelength. Depending on the desired modulus and bending stiffness at the front surface S1, intensity and an irradiation time of the UV ray 611 having the first wavelength and a concentration of the first initiator may be determined.

Figure 29F:
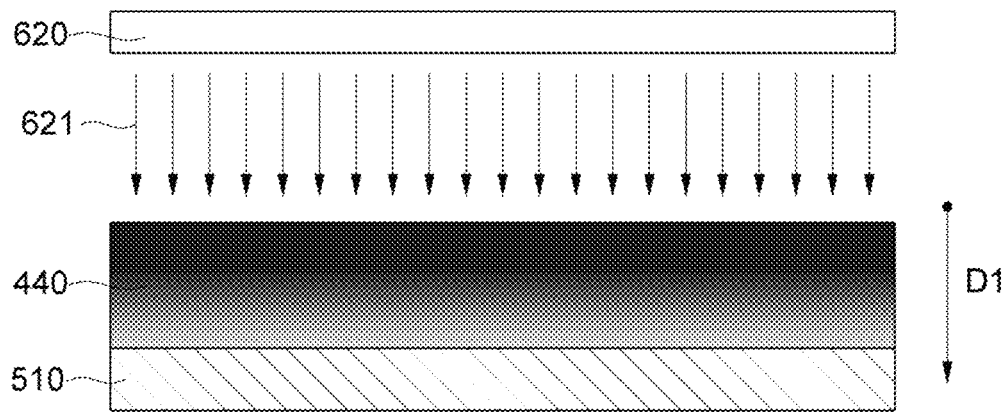

Referring to FIG. 29F, a UV lamp 620 emits a UV ray 621 to a partially cured composition 440. Only the second initiator initiates the polymerization reaction by the UV ray 621 having the second wavelength. Depending on the desired modulus and bending stiffness at the rear surface S2, intensity and an irradiation time of the UV ray 611 having the first wavelength and a concentration of the second initiator may be determined.

Curing with UV rays having the second wavelength may be performed before curing with UV rays having the first wavelength, and curing with UV rays having the first wavelength and curing with UV rays having the second wavelength may be simultaneously performed.

Figure 29G:
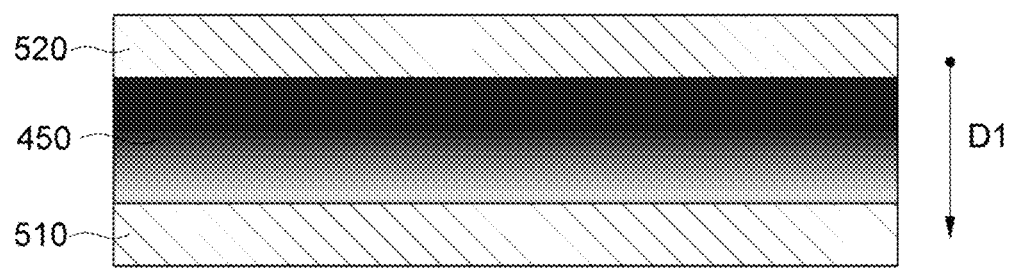

Referring to FIG. 29G, a second release film 520 is attached on a cured composition 450. The second release film 520 may be disposed on the uncured composition 430, and then curing with UV rays having the first wavelength and curing with UV rays having the second wavelength may be performed thereon. After the first release film 510 and the second release film 520 are removed, the adhesive layer 450 is attached between the display panel DP and the cover member CM.

Figure 30A:
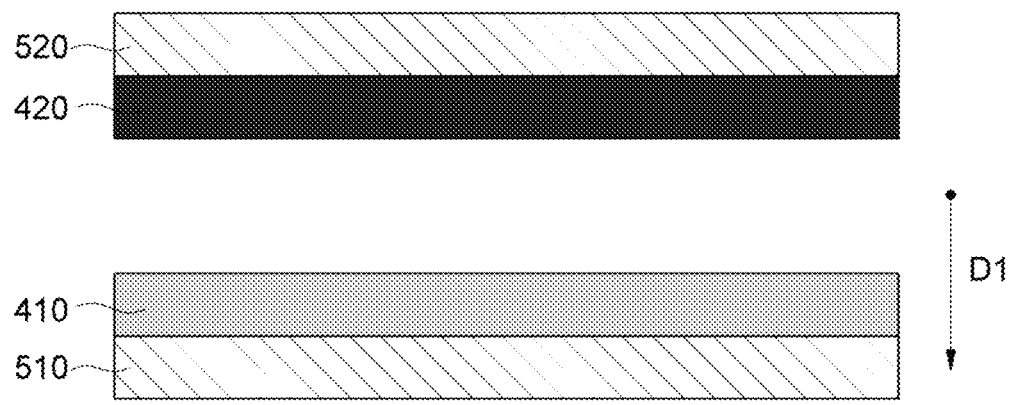
FIGS. 30A to 30C are cross-sectional views illustrating another embodiment of a method of manufacturing an adhesive layer.
Figure 30B:
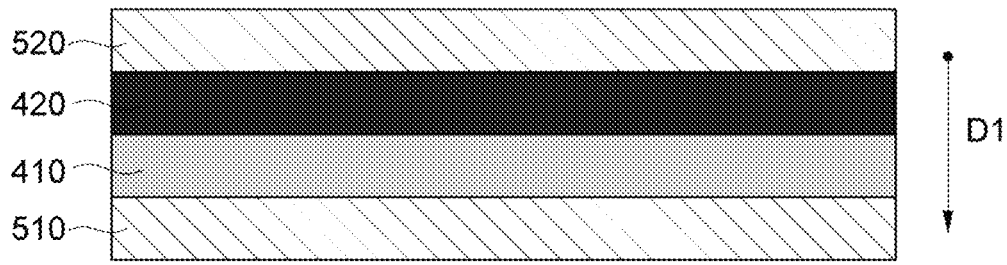
Figure 30C:
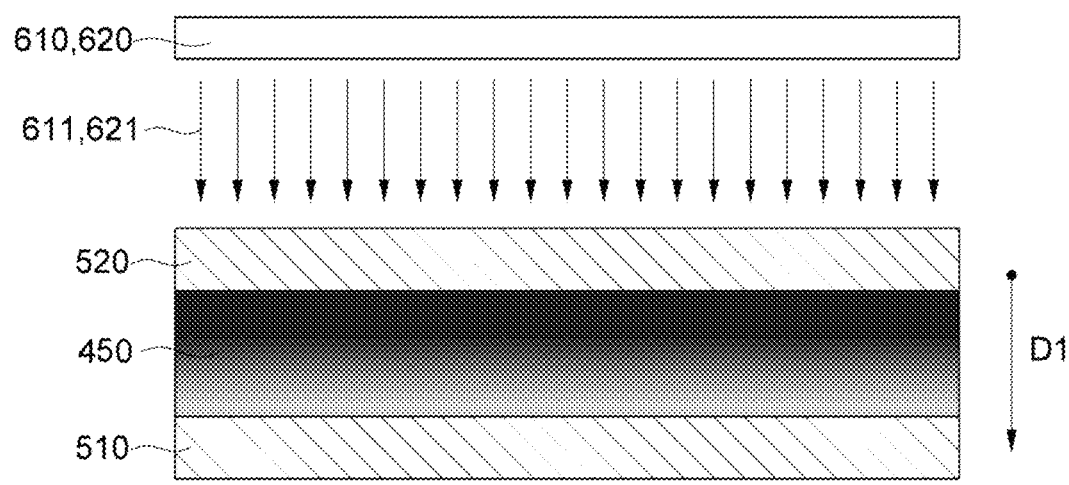

FIGS. 30A to 30C are cross-sectional views illustrating another embodiment of a method of manufacturing an adhesive layer.

Referring to FIG. 30A, a first composition 410 is applied on a first release film 510. The first composition 410 may correspond to the first composition applied from the front surface S1 to the first point P1, described with reference to FIG. 21. In addition, a second composition 420 is applied on a second release film 520. The second composition 420 may correspond to the second composition applied from the first point P1 to the rear surface S2, described with reference to FIG. 21.

Referring to FIG. 30B, the first release film 510 and the second release film 520 are laminated on each other, while the first composition 410 and the second composition 420 face each other.

Referring to FIG. 30C, the first initiator included in the first composition 410 and the second initiator included in the second composition 420 are diffused, thereby forming a composition in which the concentration of the first initiator and the second initiator varies gradually. The concentrations of the first initiator and the second initiator may correspond to those illustrated in FIG. 22.

Next, as described above with reference to FIGS. 29E and 29F, curing with the UV ray 611 having the first wavelength and curing with the UV ray 621 having the second wavelength may be performed.

FIGS. 31A to 31F are cross-sectional views illustrating still another embodiment of a method of manufacturing an adhesive layer.

Figure 31A:
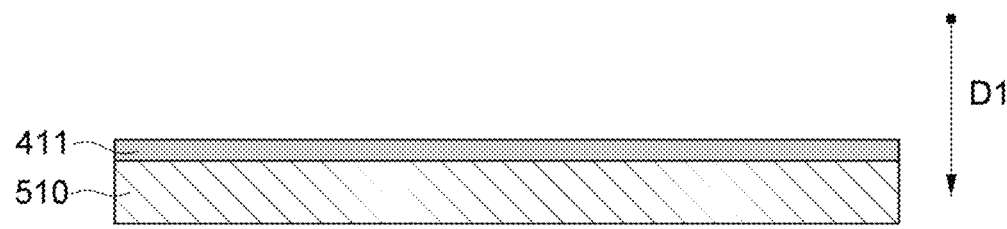
FIGS. 31A to 31F are cross-sectional views illustrating still another embodiment of a method of manufacturing an adhesive layer.

Referring to FIG. 31A, a first initiator 411 is applied on a first release film 510.

Figure 31B:
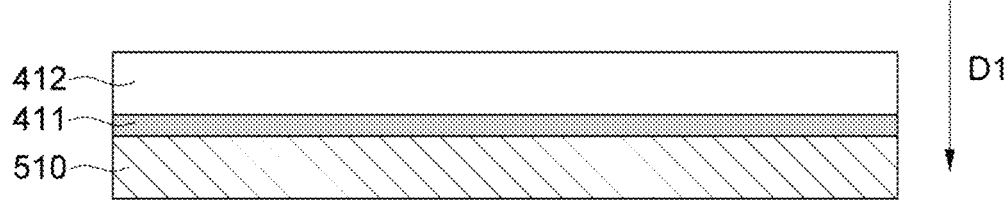

Referring to FIG. 31B, a resin 412 is applied on the first initiator 411.

Figure 31C:
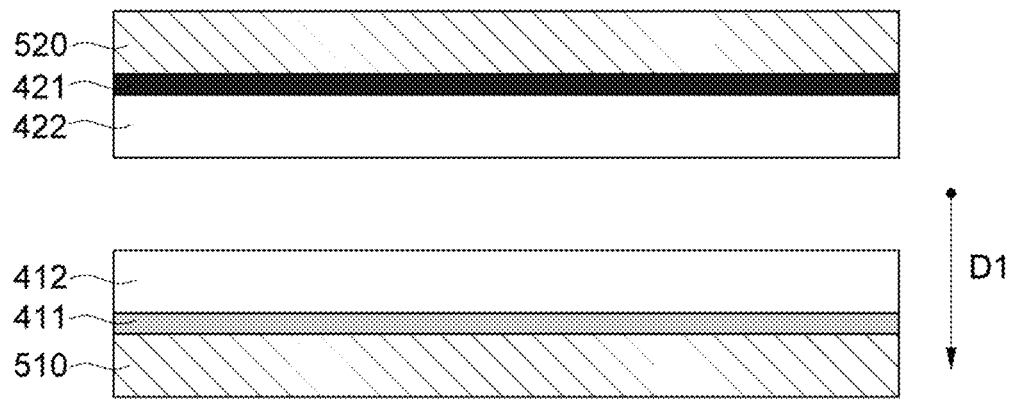

Referring to FIG. 31C, a second initiator 421 is applied on a second release film 520, and a resin 422 is applied on the second initiator 421.

Figure 31D:
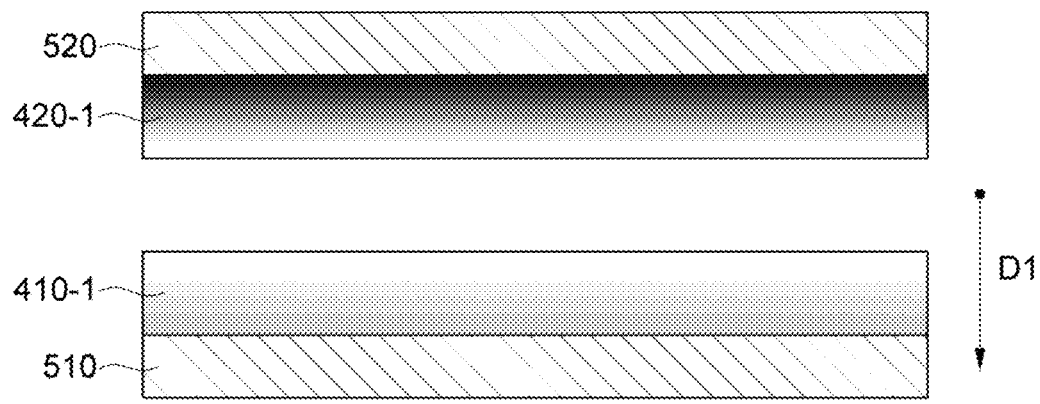

Referring to FIG. 31D, the first initiator 411 is diffused into the resin 412 to form a first composition 410-1, and the second initiator is also diffused into the resin 422 to form a second composition 420-1.

Figure 31E:
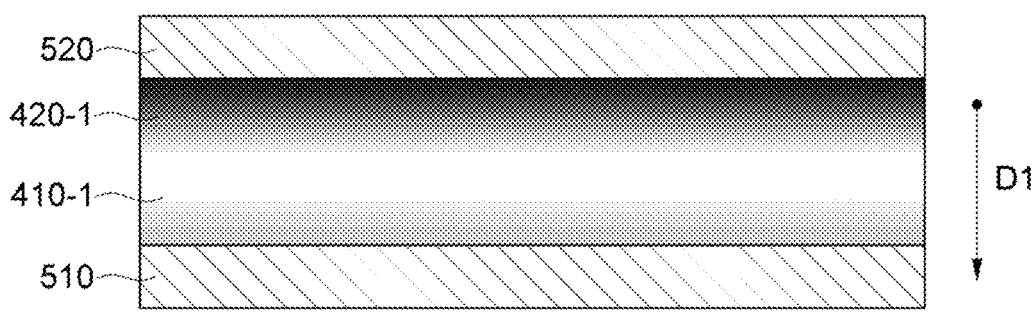

Referring to FIG. 31E, the first release film 510 and the second release film 520 are laminated on each other while both compositions 410-1 and 420-1 face each other.

Figure 31F:
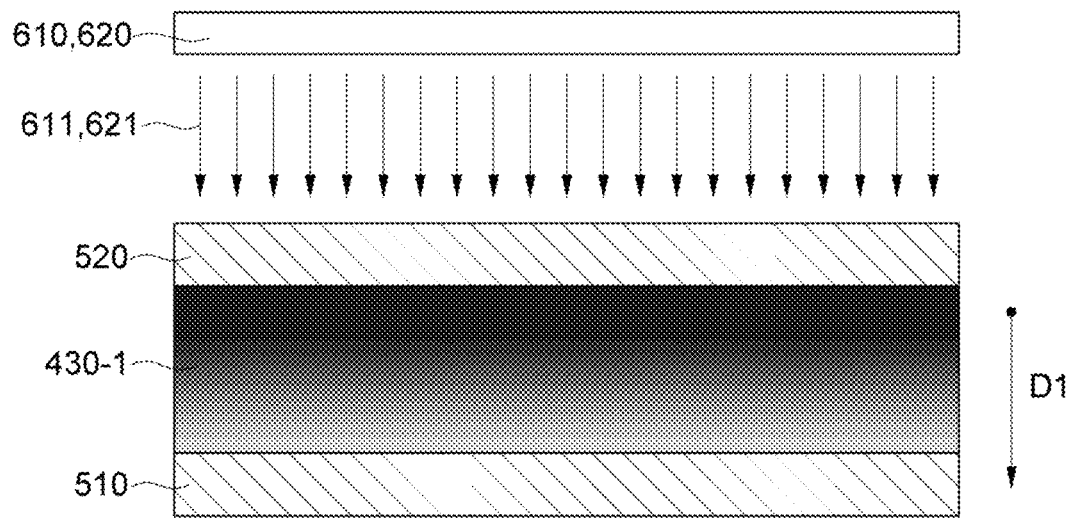

Referring to FIG. 31F, the first initiator 411 is diffused into the second composition 420-1 and the second initiator 421 is diffused into the first composition 410-1, thereby forming a composition 430-1 in which the concentration of the first initiator and the second initiator varies gradually. The concentrations of the first initiator and the second initiator may correspond to those in FIG. 22.

Next, as described above with reference to FIGS. 29E and 29F, curing with the UV ray 611 having the first wavelength and curing with the UV ray 621 having the second wavelength may be performed.

FIGS. 32A to 32D are cross-sectional views illustrating yet another embodiment of a method of manufacturing an adhesive layer.

Figure 32A:
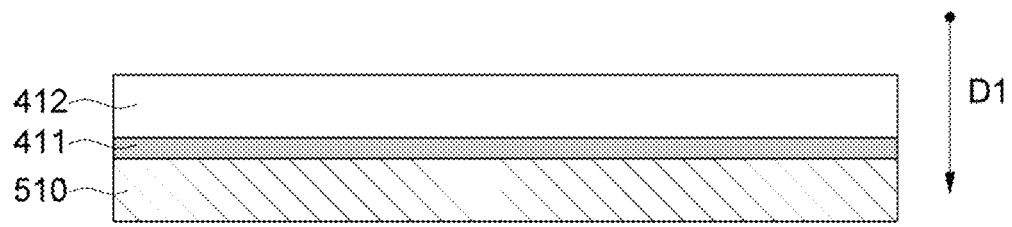
FIGS. 32A to 32D are cross-sectional views illustrating yet another embodiment of a method of manufacturing an adhesive layer.

Referring to FIG. 32A, a first initiator 411 is applied on a first release film 510, and a resin 412 is applied on the first initiator 411.

Figure 32B:
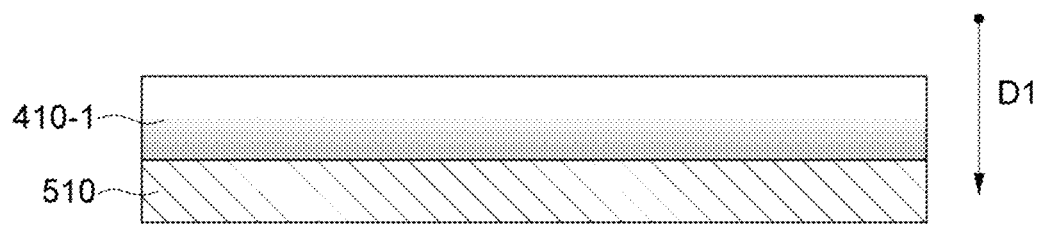

Referring to FIG. 32B, the first initiator 411 is diffused into the resin 412, thereby forming a composition 410-1 in which the concentration of the first initiator varies gradually. The concentration of the first initiator in the composition 410-1 may correspond to that illustrated in FIG. 24.

Figure 32C:
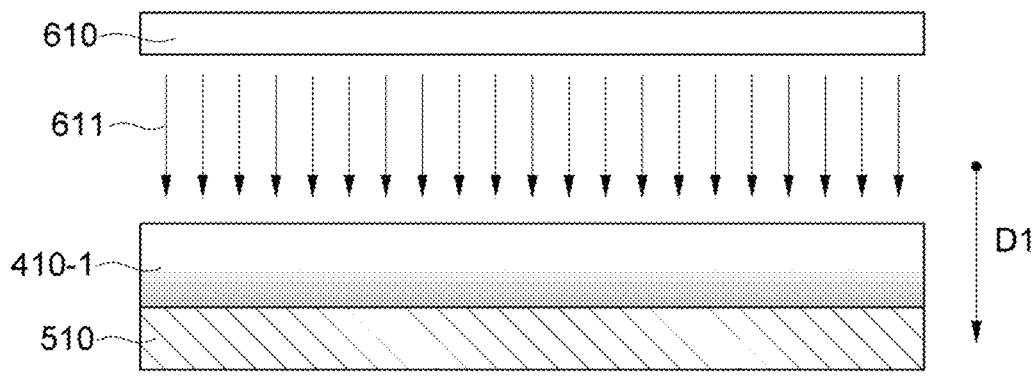

Referring to FIG. 32C, as described above with reference to FIG. 29E, curing with a UV ray 611 having the first wavelength may be performed.

Figure 32D:
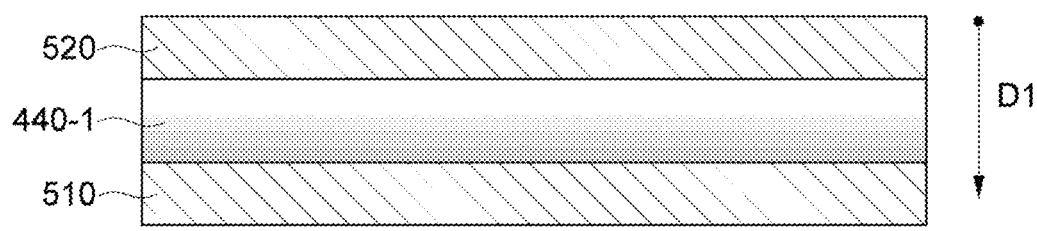

Referring to FIG. 32D, a second release film 520 is attached on a cured composition 440-1. The second release film 520 may be disposed on the composition 410-1 which is uncured, and then curing with the UV rays having the first wavelength may be performed thereon.

FIGS. 33A to 33E are cross-sectional views illustrating still yet another embodiment of a method of manufacturing an adhesive layer.

Figure 33A:
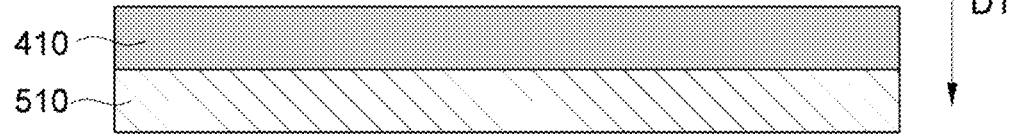
FIGS. 33A to 33E are cross-sectional views illustrating still yet another embodiment of a method of manufacturing an adhesive layer.

Referring to FIG. 33A, a first release film 510 at which an adhesive layer is to be formed is prepared, and a first composition 410 is applied on the first release film 510. The first composition 410 may correspond to the first composition applied from the front surface S1 to the fifth point P5, described above with reference to FIG. 25.

Figure 33B:
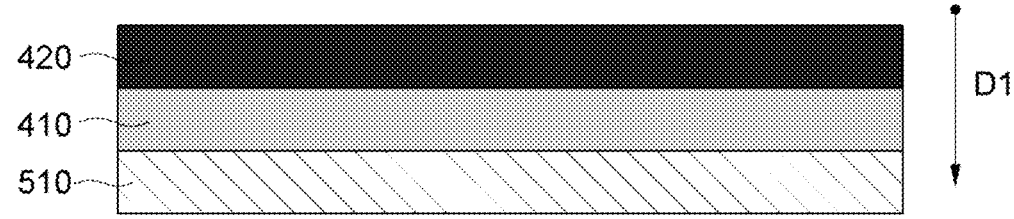

Referring to FIG. 33B, a second composition 420 is applied on the first composition 410. The second composition 420 may correspond to the second composition applied from the fifth point P5 to the sixth point P6, described with reference to FIG. 25.

Figure 33C:
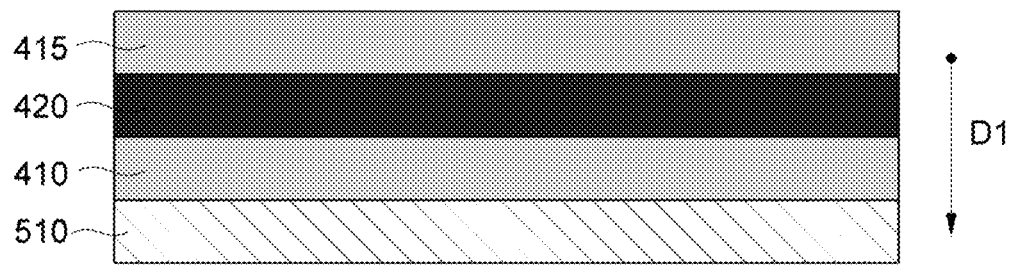

Referring to FIG. 33C, a third composition 415 is applied on the second composition 420. The third composition 415 may correspond to the third composition applied from the sixth point P6 to the rear surface S2, described above with reference to FIG. 25. The third composition 415 may be substantially the same as the first composition 410.

Figure 33D:
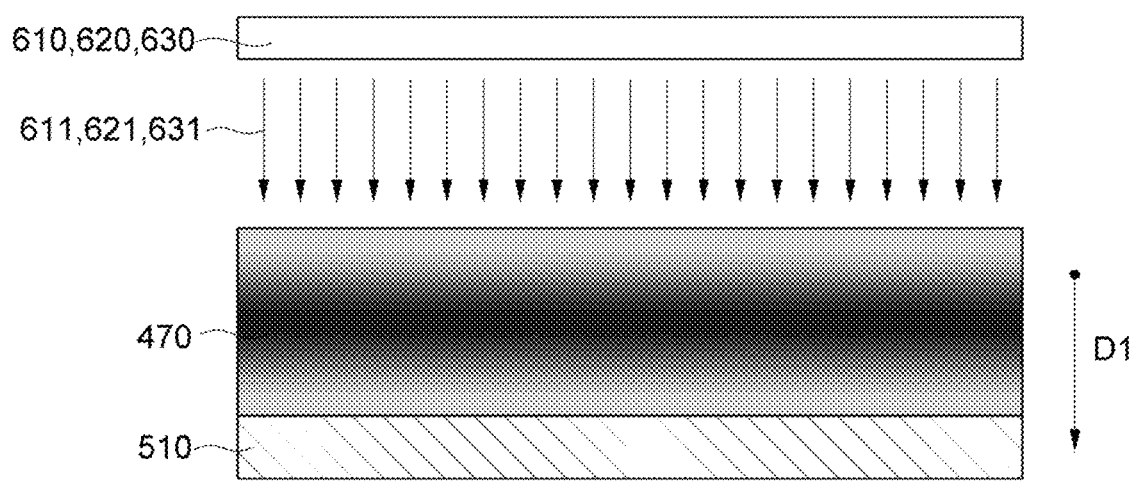

Referring to FIG. 33D, the first initiator included in the first composition 410, the second initiator included in the second composition 420, and the third initiator included in the third composition 415 are diffused, thereby forming a composition 470 in which the concentration of the first initiator, the second initiator, and the third initiator varies gradually in the first direction D1. The concentrations of the first initiator, the second initiator, and the third initiator in the composition 470 may correspond to those in FIG. 26.

Next, to the composition 470 which is uncured, a UV lamp 610 emits a UV ray 611 having a first wavelength, a UV lamp 620 emits a UV ray 621 having a second wavelength, and a UV lamp 630 emits a UV ray 631 having a third wavelength. The first, second, and third wavelengths correspond to active wavelength bands of the first, second, and third wavelengths, respectively.

Figure 33E:
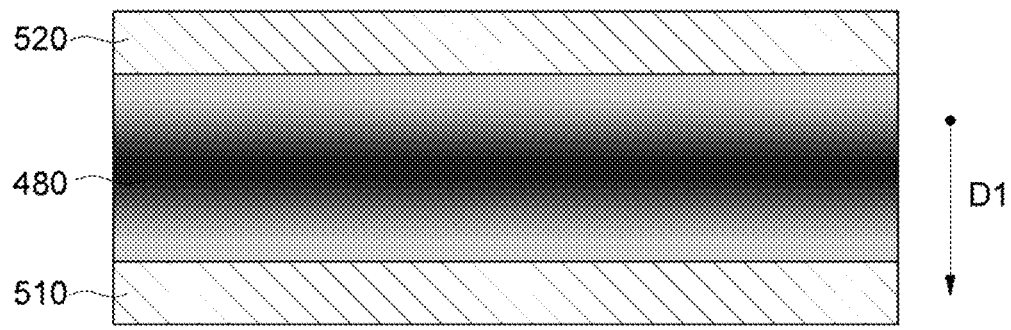

Referring to FIG. 33E, a second release film 520 is attached on a cured composition 480. The second release film 520 may be disposed on the composition 470 which is uncured, and then curing may be performed thereon.

Figure 34:
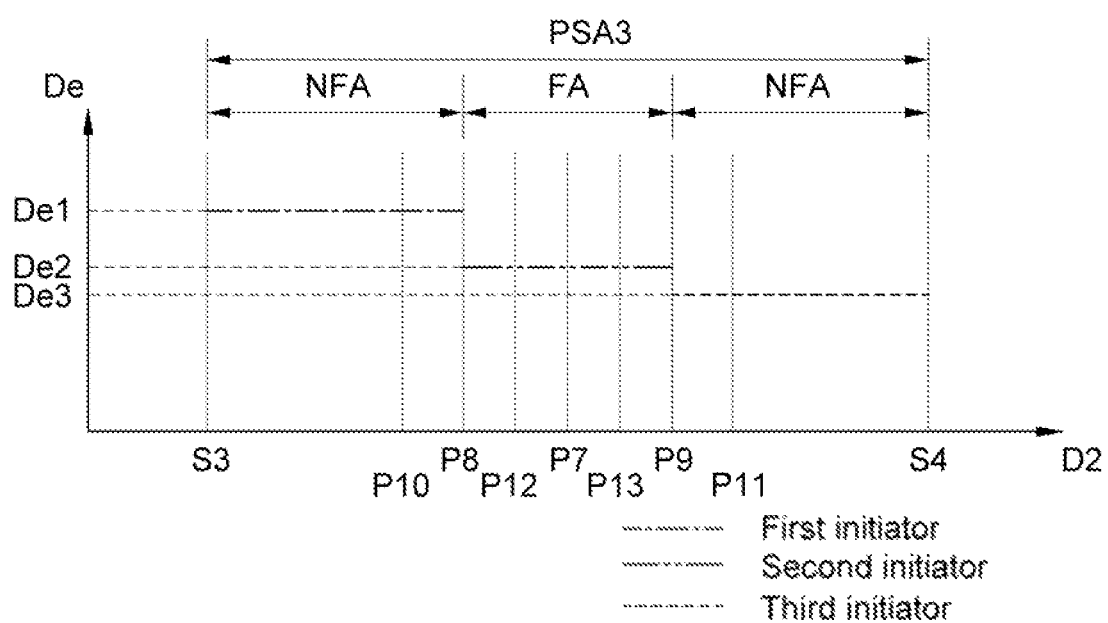
FIGS. 34 and 35 are graphs each illustrating a concentration of an initiator before curing an adhesive layer according to embodiments.
Figure 35:
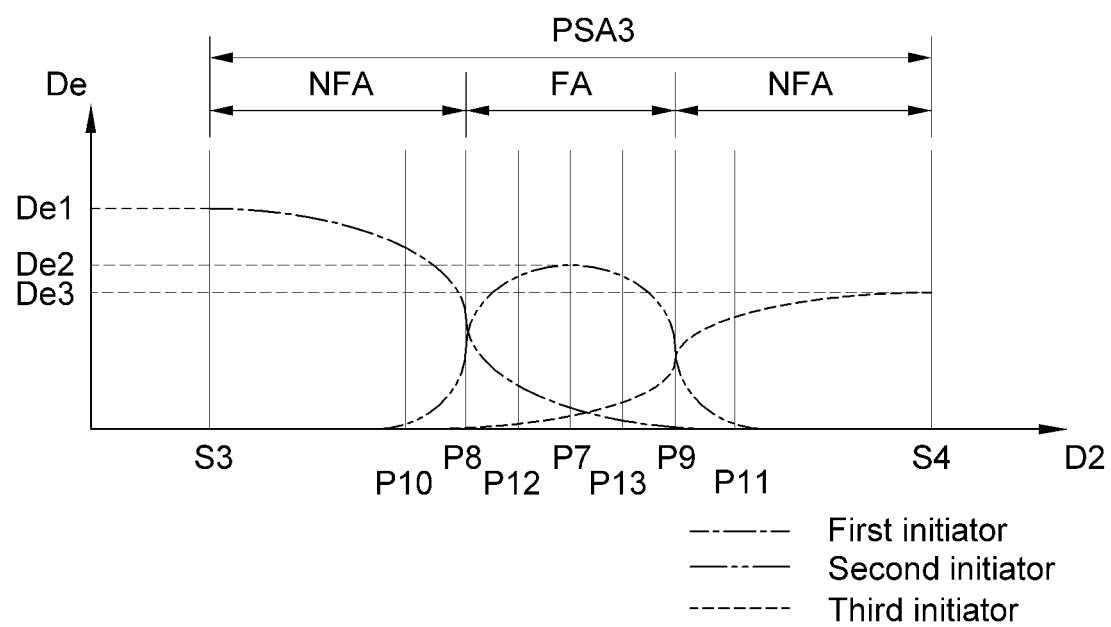

FIGS. 34 and 35 are graphs each illustrating a concentration of an initiator before curing an adhesive layer according to embodiments. In FIGS. 34 and 35, a vertical axis denotes a concentration of the initiator, and a horizontal axis denotes a position in the second direction D2.

Referring to FIG. 34, the composition includes a first composition applied from the first side surface S3 to the eighth point P8, a second composition applied from the eighth point P8 to the ninth point P9, and a third composition applied from the ninth point P9 to the second side surface S4.

The first composition includes a resin and a first initiator. The second composition includes a resin and a second initiator. The third composition includes a resin and a third initiator. The first composition, the second composition, and the third composition may include substantially the same resin. The first initiator, the second initiator, and the third initiator may have different active wavelength bands. Alternatively, the first initiator and the third initiator may have active wavelength bands different from the active wavelength band of the second initiator, and the first initiator and the third initiator may have substantially the same active wavelength band. The first initiator and the third initiator may include the substantially same material.

Referring to FIG. 34, the first initiator has a concentration of De1 from the first side surface S3 to the eighth point P8 and is not included in the rest. The second initiator has a concentration of De2 from the eighth point P8 to the ninth point P9 and is not included in the rest. The third initiator has a concentration of De3 from the ninth point P9 to the second side face S4 and is not included in the rest. The concentrations of De1, De2 and De3 may be substantially the same as each other or may be different from each other. The concentrations of De1 and De3 may be substantially the same as each other and may be different from the concentration of De2.

Referring to FIG. 35, the first initiator has a concentration of De1 at the first side surface S3, and the concentration decreases, as closer to the second side surface S2. The second initiator has a concentration of De2 at the seventh point P7, and the concentration decreases, as closer to the first side surface S3 or the second side surface S4. The third initiator has a concentration of De3 at the second side S4, and the concentration decreases, as closer to the first side surface S3. The first initiator, the second initiator, and the third initiator may each have a constant concentration adjacent to the first side surface S3, the seventh point P7, and the second side surface S4.

The concentration graph of FIG. 34 may correspond to a state immediately after the application of the first composition, the second composition and the third composition, and FIG. 35 may correspond to a state in which the first composition, the second composition and the third composition are diffused after the application of the first composition, the second composition and the third composition.

Referring to FIGS. 34 and 35, the curing of the non-folding area NFA is mainly affected by the first initiator and the third initiator, and the curing of the folding area FA is mainly affected by the second initiator. Accordingly, the curing degree of the folding area FA and the non-folding area NFA may be determined independently. For example, it may be cured to have a modulus or bending stiffness illustrated in FIGS. 18 to 20.

FIGS. 36A to 36E are cross-sectional views illustrating yet still another embodiment of a method of manufacturing an adhesive layer.

Figure 36A:
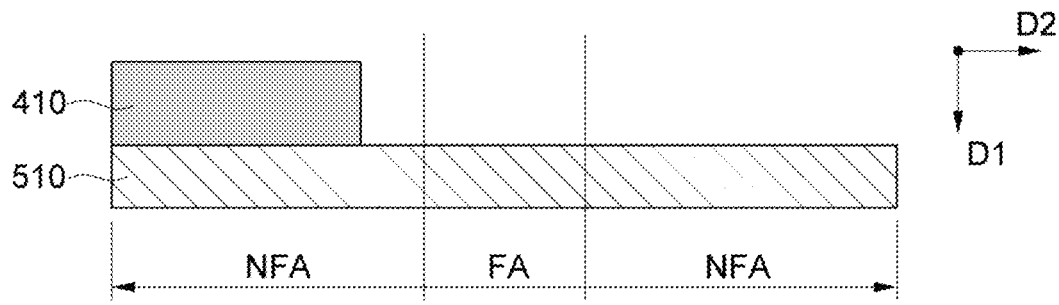
FIGS. 36A to 36E are cross-sectional views illustrating yet still another embodiment of a method of manufacturing an adhesive layer.

Referring to FIG. 36A, a first release film 510 at which an adhesive layer is to be formed is prepared, and a first composition 410 is applied on the first release film 510. The first composition 410 may correspond to the first composition applied from the first side surface S3 to the eighth point P8, described above with reference to FIG. 34.

Figure 36B:
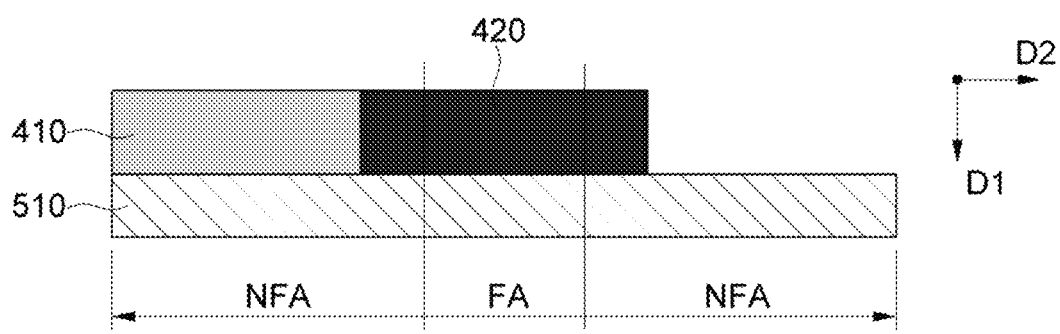

Referring to FIG. 36B, a second composition 420 is applied on the first release film 510 so as to contact the first composition 410. The second composition 420 may correspond to the second composition applied from the eighth point P8 to the ninth point P9, described above with reference to FIG. 34. An area from the eighth point P8 to the ninth point P9 may correspond to the folding area FA. The area from the eighth point P8 to the ninth point P9 may be larger than the folding area FA and may include the entire folding area FA.

Figure 36C:
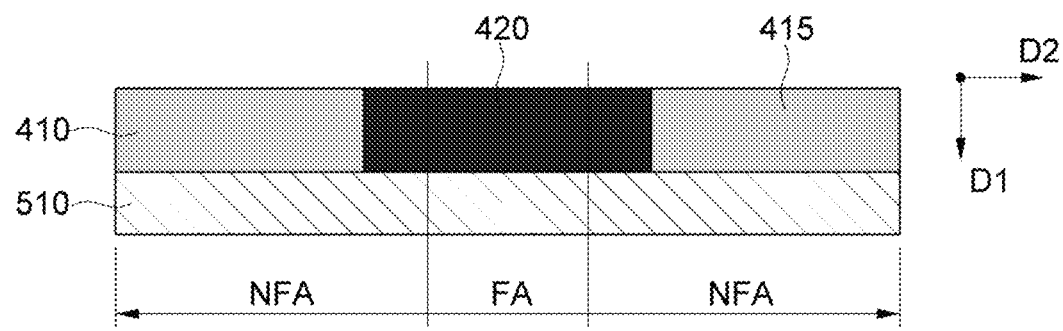

Referring to FIG. 36C, a third composition 415 is applied on the first release film 510 so as to contact the second composition 420. The third composition 415 may correspond to the third composition applied from the ninth point P9 to the second side surface S4, described with reference to FIG. 34.

Figure 36D:
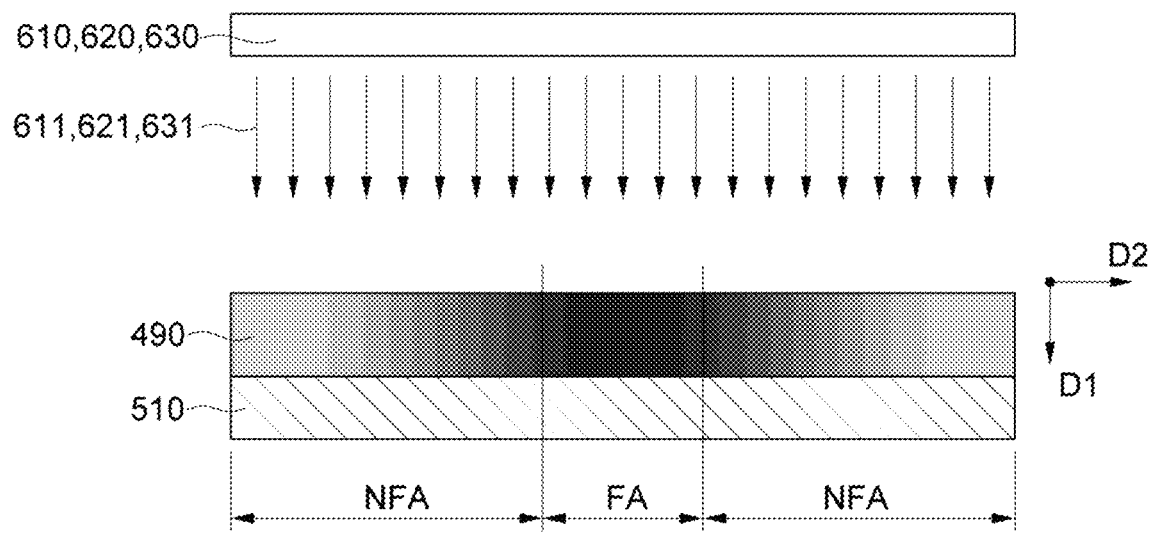

Referring to FIG. 36D, the first initiator included in the first composition 410, the second initiator included in the second composition 420, and the third initiator included in the third composition 415 are diffused such that the concentration of the first initiator, the second initiator, and the third initiator varies gradually in the second direction. The concentration of the first initiator, the second initiator, and the third initiator may correspond to that illustrated in FIG. 35.

Next, to an uncured composition 490, a UV lamp 610 emits a UV ray 611 having a first wavelength, a UV lamp 620 emits a UV ray 621 having a second wavelength, and a UV lamp 630 emits a UV ray 631 having a third wavelength. The first, second, and third wavelengths correspond to active wavelength bands of the first, second, and third initiators, respectively.

Figure 36E:
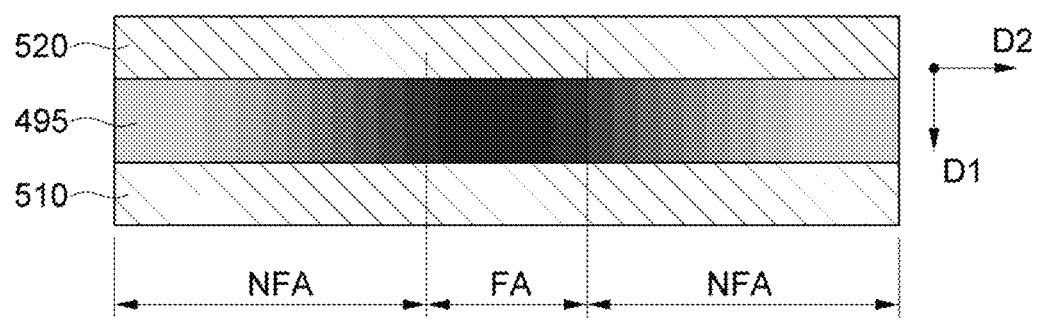

Referring to FIG. 36E, a second release film 520 is attached on a cured composition 495. The second release film 520 may be disposed on the uncured composition 490, and then curing may be performed thereon.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing an adhesive film for a display device, the method comprising:
   forming, on a first release film, a first composition comprising a resin and a first initiator for initiating a polymerization reaction of the resin;
   forming, on the first composition which has been applied, a second composition comprising the resin and a second initiator for initiating the polymerization reaction of the resin;
   irradiating the first composition and the second composition, which have been applied, with light having a first range of wavelengths; and
   irradiating the first composition and the second composition, which have been applied, with light having a second range of wavelengths,
   wherein the first initiator initiates the polymerization reaction of the resin with the light having the first range of wavelengths without activating initiation of the polymerization reaction with the light having the second range of wavelengths, and
   wherein the second initiator initiates the polymerization reaction of the resin with the light having the second range of wavelengths without activating the initiation of the polymerization reaction with the light having the first range of wavelengths.

2. The method of claim 1, further comprising:
   forming, on the second composition, a third composition comprising the resin and a third initiator,
   wherein the third initiator initiates the polymerization reaction of the resin with light having a third range of wavelengths without activating the initiation of the polymerization reaction with the light having the second range of wavelengths.

3. The method of claim 2, wherein the third initiator initiates the polymerization reaction of the resin with the light having the third range of wavelengths without activating the initiation of the polymerization reaction with the light having the first range of wavelengths.

4. The method of claim 1, wherein an irradiation time of the light having the first range of wavelengths is different from an irradiation time of the light having the second range of wavelengths.

5. The method of claim 1, wherein intensity of the light having the first range of wavelengths is different from intensity of the light having the second range of wavelengths.

6. The method of claim 1, wherein a concentration of the first initiator with respect to the first composition is different from a concentration of the second initiator with respect to the second composition.

7. The method of claim 1, wherein the forming of the second composition on the first composition comprises:
   applying the second composition on a second release film; and
   laminating the first release film and the second release film on each other in a state in which the first composition and the second composition, which have been applied, face each other.

8. The method of claim 7, wherein the forming of the first composition on the first release film comprises:
   applying the first initiator on the first release film; and
   applying the resin on the first initiator which has been applied, and
   wherein the applying of the second composition on the second release film comprises:
   applying the second composition on the second release film; and
   applying the resin on the second initiator which has been applied.

* * * * *